United States Patent [19]
Sakao

[11] Patent Number: 5,759,889
[45] Date of Patent: Jun. 2, 1998

[54] METHOD FOR MANUFACTURING SEMICONDUCTOR DEVICE INCORPORATING DRAM SECTION AND LOGIC CIRCUIT SECTION

[75] Inventor: Masato Sakao, Tokyo, Japan

[73] Assignee: NEC Corporation, Japan

[21] Appl. No.: 781,960

[22] Filed: Dec. 20, 1996

[30] Foreign Application Priority Data

Dec. 26, 1995 [JP] Japan ................................. 7-338976

[51] Int. Cl.$^6$ ................................. H01L 21/8242
[52] U.S. Cl. ................................. 438/241; 438/649
[58] Field of Search ................................. 438/210, 240, 438/241, 253, 396, 649

[56] References Cited

U.S. PATENT DOCUMENTS 5,269,402  12/1993  Ryou ................................. 438/241
5,296,399   3/1994  Park ................................. 438/241
5,627,093   5/1997  Hachisuka et al. ................................. 438/649

OTHER PUBLICATIONS

Jerome B. Lasky et al., "Comparison of Transformation to Low-Resistivity Phase and Agglomeration of $TiSi_2$ and $CoSi_2$", IEEE Trans of Electron Devices, vol. 38, No. 2, pp. 262–269, Feb. 1991.

*Primary Examiner*—Chandra Chaudhari
*Attorney, Agent, or Firm*—Hayes, Soloway, Hennessey, Grossman & Hage, P.C.

[57] ABSTRACT

In a method for manufacturing a semiconductor device incorporating a DRAM section and a logic circuit section, a refractory metal layer is formed to cover a bit line of the DRAM section, and a gate electrode and impurity diffusion regions of the logic circuit section. Then, a heating operation is performed upon sadi refractory metal layer, so that metal silicide layers are formed in the bit line of the DRAM section, and the gate electrode and the impurity diffusion regions of the logic circuit section.

10 Claims, 28 Drawing Sheets

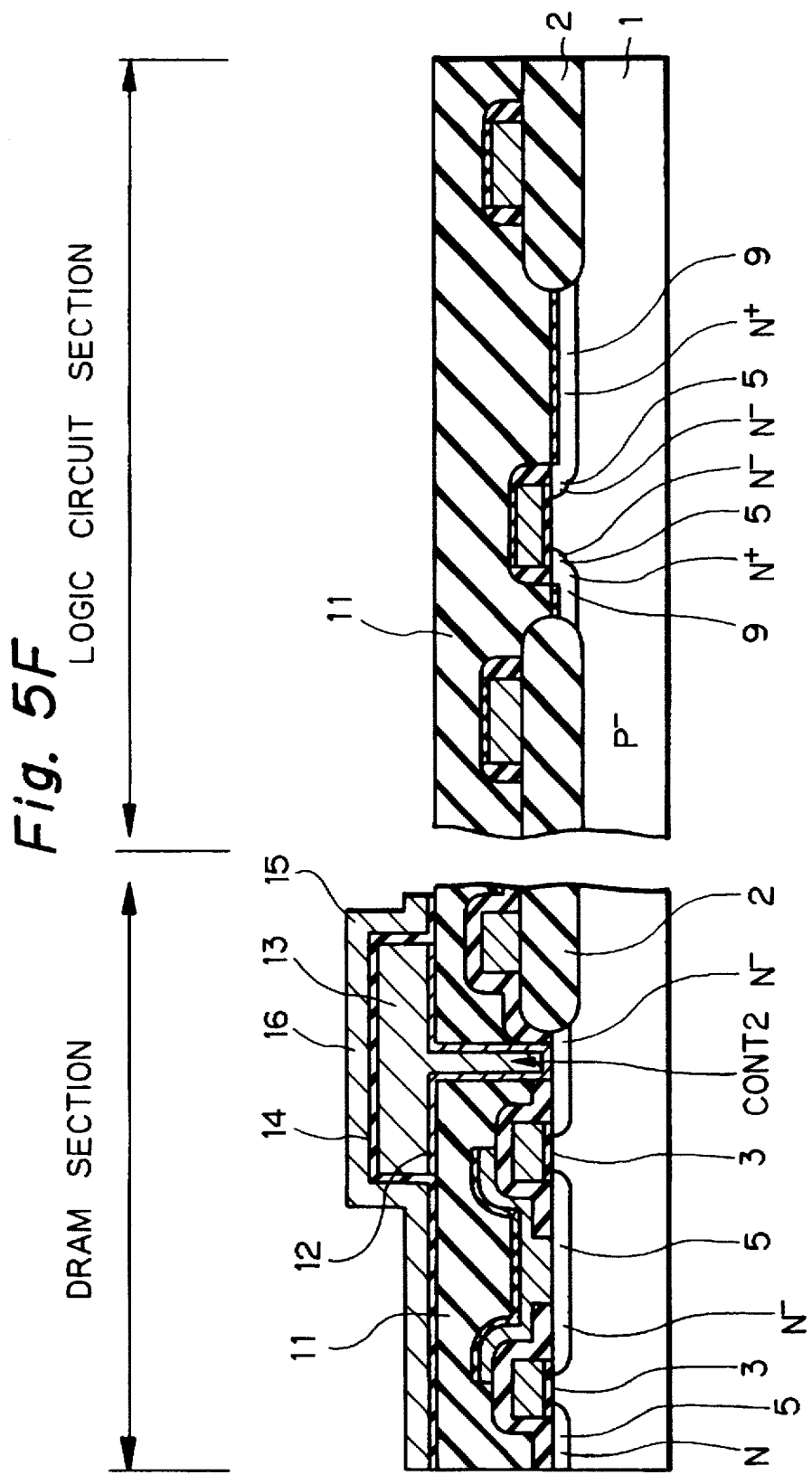

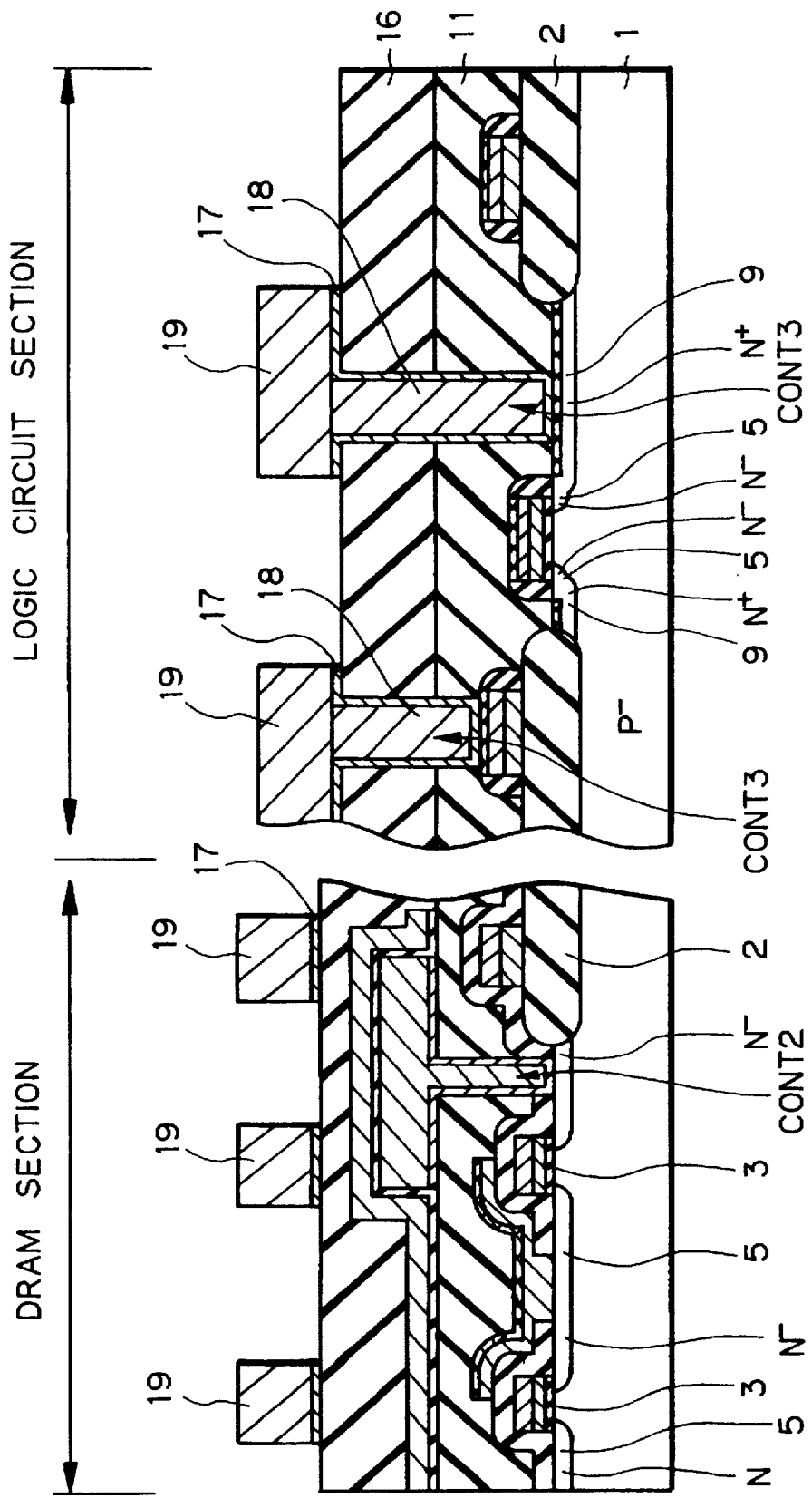

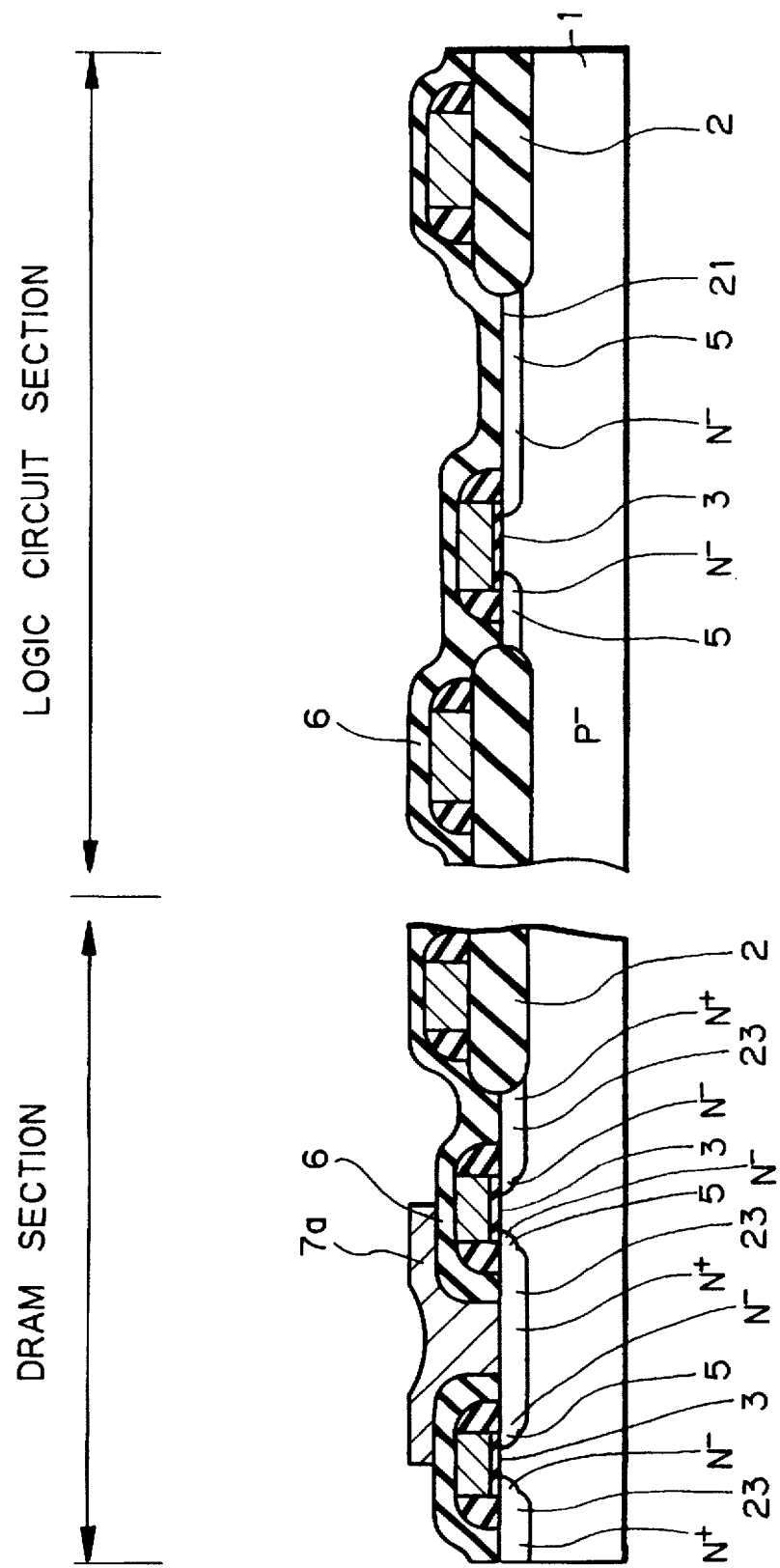

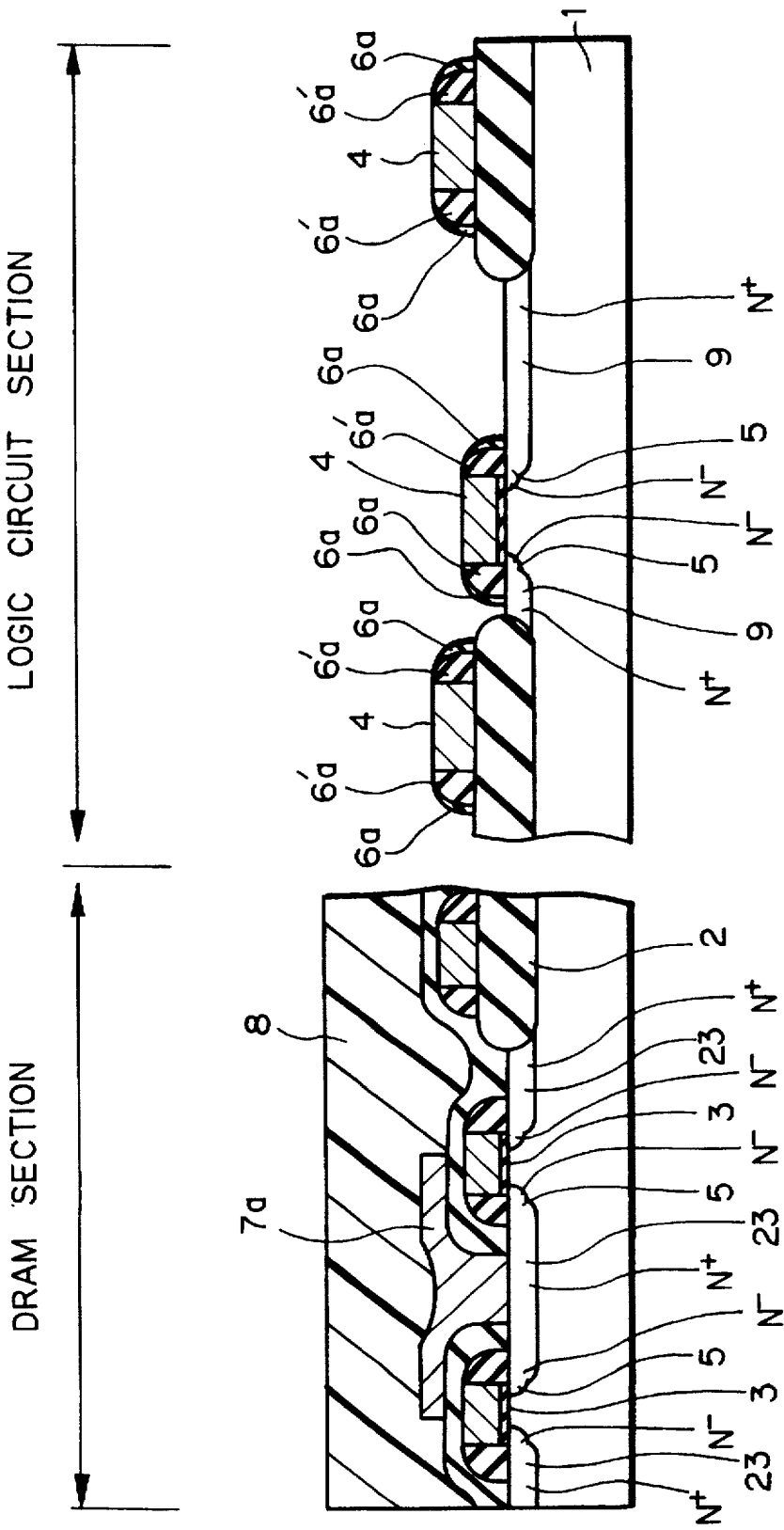

METHOD FOR MANUFACTURING SEMICONDUCTOR DEVICE INCORPORATING DRAM SECTION AND LOGIC CIRCUIT SECTION

BACKGROUND OF THE INVENTION

1. Field of the Invention

The present invention relates to a method for manufacturing a semiconductor device, and more particularly, to a method for manufacturing a semiconductor device incorporating a dynamic random access memory (DRAM) section and a logic integrated circuit (IC) section.

2. Description of the Related Art

As microprocessors have been developed, the operating frequency has been remarkably increased, and the number of processed bits has been remarkably increased. Such microprocessors are required to incorporate memory functions. That is, memory elements such as static random access memory (SRAM) elements and DRAM elements as well as logic elements are required to be formed on the same semiconductor chip.

Since SRAM elements have a similar configuration and a similar manufacturing process to those of logic circuit elements, SRAM elements can be easily incorporated into the semiconductor chip of logic circuit elements. Actually, cache memories comprised of SRAM elements have been incorporated into microprocessors for some time.

On the other hand, since the configuration and manufacturing process of DRAM elements are quite different from those of logic circuit elelemts, it is difficult to incorporate DRAM elements into the semiconductor chip of logic circuit elements.

That is, in a prior art method for manufacturing a logic circuit device, a refractory metal layer is formed on a gate electrode and impurity diffusion regions, and a heating operation is performed thereupon. As a result, self-aligned-silicide (salicide) layers are formed in the gate electrode and the impurity diffusion regions. Thus, the resistance of the gate electrode and the impurity diffusion regions is reduced to improve the performance of the device. This will be explained later in detail.

In this prior art method, since no heating operation at a temperature higher than 800° C. is carried out after the formation of the salicide layers, the agglomeration of the salicide layers is suppressed, which suppresses the increase of sheet resistance of the salicide layers.

Note that it is known that, when a heating operation at a temperature higher than 800° C. is performed upon salicide layers, the salicide layers are agglomerated to increase the resistance thereof (see: Jerome B. Lasky et al., "Comparison of Transformation to Low-Resistivity Phase and Agglomeration of TiSi$_2$ and CoSi$_2$", IEEE Trans. of Electron Devices, Vol. 38, No. 2, pp. 262–269, Feb. 1991).

On the other hand, in a prior art method for manufacturing a DRAM device, the manufacturing processes are complex, and a plurality of heating processes are required before the formation of aluminum layers. This also will be explained later in detail.

Therefore, if the logic circuit device and the DRAM device are formed on the same semiconductor chip, manufacturing processes are mainly dependent upon the manufacturing processes of the DRAM device, and the number of manufacturing steps is increased, which increases the manufacturing cost. Also, since a plurality of heating processes for the DRAM device are required after the formation of the salicide layers, the salicide layers are agglomerated, which increases the sheet resistance of the salicide layers.

SUMMARY OF THE INVENTION

It is an object of the present invention to provide a method for manufacturing a semiconductor device incorporating a DRAM section and a logic circuit section, which can reduce the manufacturing cost and suppress the agglomeration of salicide layers.

According to the present invention, in a method for manufacturing a semiconductor device incorporating a DRAM section and a logic circuit section, a refractory metal layer is formed to cover a bit line of the DRAM section, and a gate electrode and impurity diffusion reigons of the logic circuit section. Then, a heating operation is performed upon the refractory metal layer, so that metal silicide layers are formed in the bit line of the DRAM section, and the gate electrode and the impurity diffusion regions of the logic circuit section.

BRIEF DESCRIPTION OF THE DRAWINGS

The present invention will be more clearly understood from the description as set forth below, as compared with the prior art, with reference to the accompanying drawings, wherein:

FIGS. 5A through 5G are cross-sectional views for explaining a first embodiment of the method for manufacturing a semiconductor device according to the present invention;

FIGS. 6A through 6H are cross-sectional views for explaining a second embodiment of the method for manufacturing a semiconductor device according to the present invention; and FIGS. 7A through 7I are cross-sectional views for explaining a third embodiment of the method for manufacturing a semiconductor device according to the present invention.

DESCRIPTION OF THE PREFERRED EMBODIMENTS

Before the description of the preferred embodiments, a prior art logic circuit device and a prior art DRAM device will be explained with reference to FIGS. 1, 2, 3 and 4.

Figure 1:
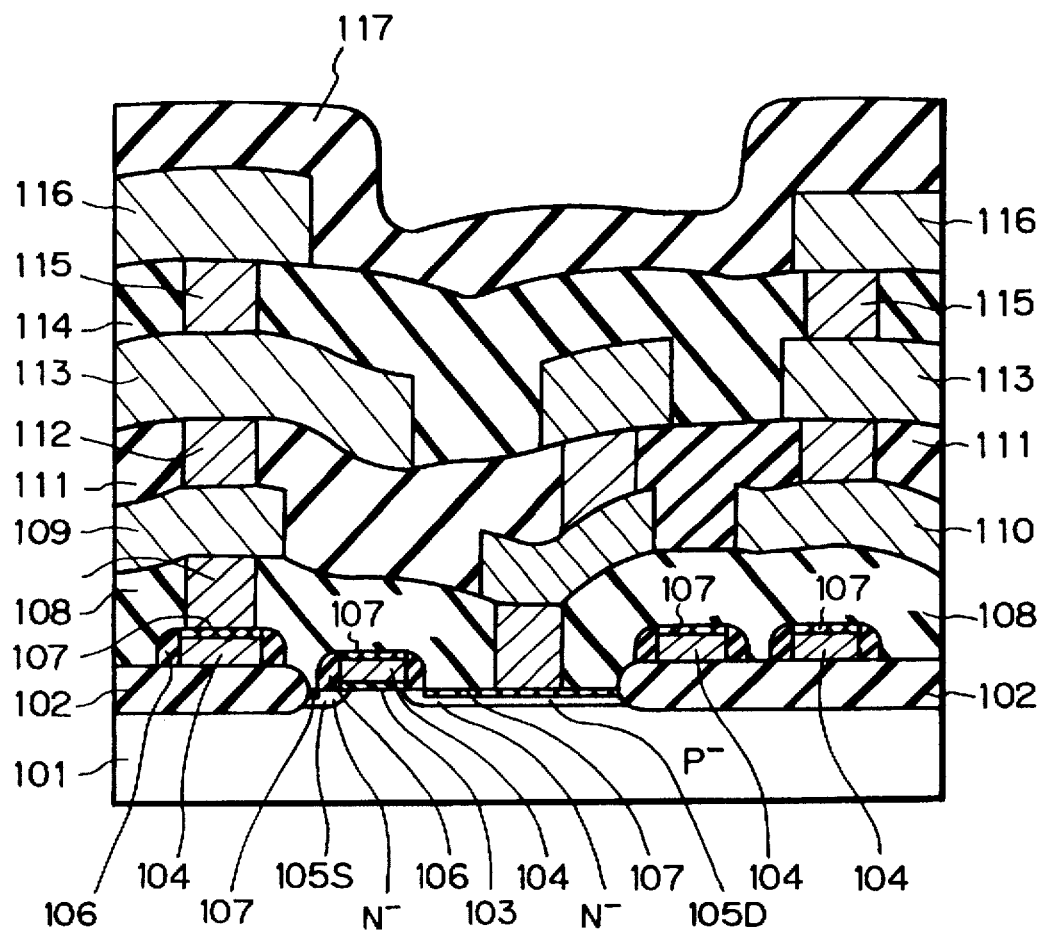
FIG. 1 is a cross-sectional illustrating a prior art logic circuit device.

In FIG. 1, which is a cross-sectional view illustrating a logic circuit device, reference numeral 101 designates a P$^-$-type monocrystalline silicon substrate. The silicon substrate 101 is partitioned by a field silicon oxide layer 102 which is formed by thermally oxidizing the silicon substrate 101 by using a local oxidation of silicon (LOCOS) process. Also, a gate silicon oxide layer 103 and a gate electrode 104 made of polycrystalline silicon are formed on the silicon substrate 101. Further, an N$^-$-type impurity diffusion region 105S and an N$^-$-type impurity diffusion region 105D are formed within the silicon substrate 101 in self-alignment with the field silicon oxide layer 102 and the gate electrode 104.

Sidewall silicon oxide layers 106 are formed on the sidewall of the gate electrode 104. In this state, salicide layers 107 are formed in gate electrode 104, the source region 105S and the drain region 105D, by reacting refractory metal such as Ti with polycrystalline silicon. As a result, the sheet resistances of the gate electrode 104, the source region 105S and the drain region 105D are substantially reduced.

An insulating layer 108 made of silicon oxide is formed on the entire surface, and a contact structure 109 is formed within a contact hole of the insulating layer 108. Also, an aluminum layer 110 is formed on the insulating layer 108 and is connected to the contact structure 109.

In addition, an insulating layer 111 made of silicon oxide is formed on the entire surface, and a contact structure 112 is formed within a contact hole of the insulating layer 111. Also, an aluminum layer 113 is formed on the insulating layer 111 and is connected to the contact structure 112.

Further, an insulating layer 114 made of silicon oxide is formed on the entire surface, and a contact structure 115 is formed within a contact hole of the insulating layer 114. Also, an aluminum layer 116 is formed on the insulating layer 115 and is connected to the contact structure 116.

Still further, an insulating layer 117 made of silicon oxide or silicon oxide nitride is formed on the entire surface.

In the logic circuit device of FIG. 1, since no heating operation at a temperature higher than 800° C. is carried out after the formation of the salicide layer 107, the agglomeration of the salicide layer 107 is suppressed, which suppresses the increase of sheet resistance of the salicide layer 107.

Figure 2:
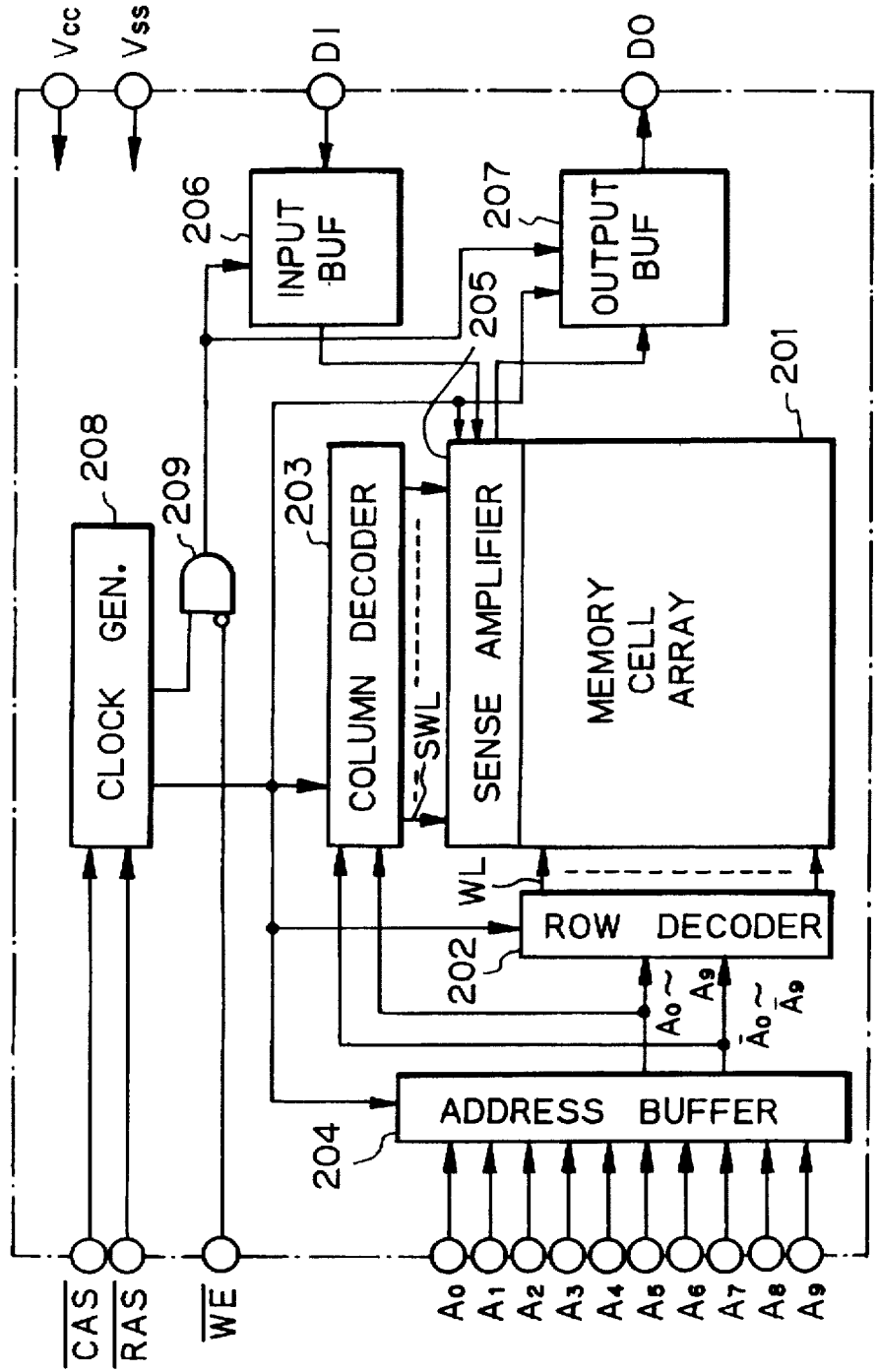
FIG. 2 is a block circuit diagram illustrating a prior art DRAM device.
Figure 3:
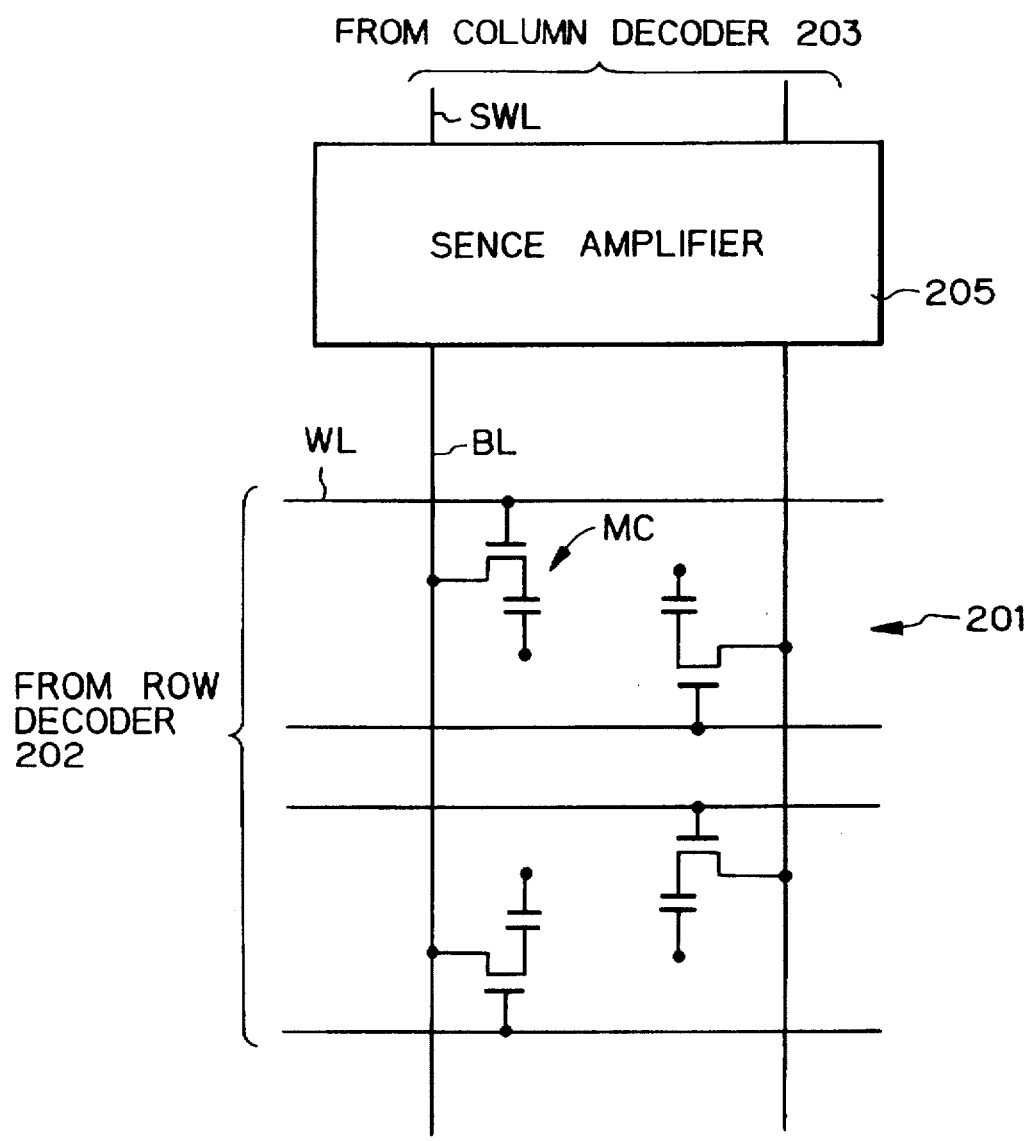
FIG. 3 is a circuit diagram of the memory cell array of FIG. 2.

In FIG. 2, which is a block circuit diagram illustrating a prior art DRAM device, reference numeral 201 designates a memory cell array having memory cells MC at intersections between word lines WL and bit lines BL as illustrated in FIG. 3.

One of the word lines WL is selected by a row decoder 202, and one of the bit lines BL, i.e., one of column switch lines SWL is selected by a column decoder 203. The row decoder 202 and the column decoder 204 receive multiplexed address signals $A_0$ to $A_9$ from an address buffer 204.

A sense amplifier 205 is connected to the bit lines BL for sensing data from a selected memory cell. The sense amplifier 205 is connected to a data input buffer 206 and a data output buffer 207 which are connected to a data input terminal DI and a data output terminal DO, respectively.

The row decoder 202, the column decoder 203, the address buffer 204, the sense amplifier 205, the data input buffer 206 and the data output buffer 207 are controlled by a clock signal generator 208 and a gate circuit 209. In this case, the clock signal generator 208 receives an inverted signal of a row address strobe signal RAS, and an inverted signal of a column address strobe signal (CAS). Also, the gate circuit 209 receives a clock signal from the clock signal generator 208 and an inverted signal of a write enable signal WE. Note that, when the output signal of the gate circuit 209 is high, the data input buffer 206 is activated and the data output buffer 207 is deactivated. Contrary to this, when the output signal of the gate circuit 209 is low, the data input buffer 206 is deactivated and the data output buffer 207 is activated.

Further, in FIG. 2, references $V_{cc}$ and $V_{ss}$ designate power supply terminals.

The memory cells MC of FIG. 3, which are of a one-transistor, one-capacitor type, are explained next with reference to FIG. 4.

Figure 4:
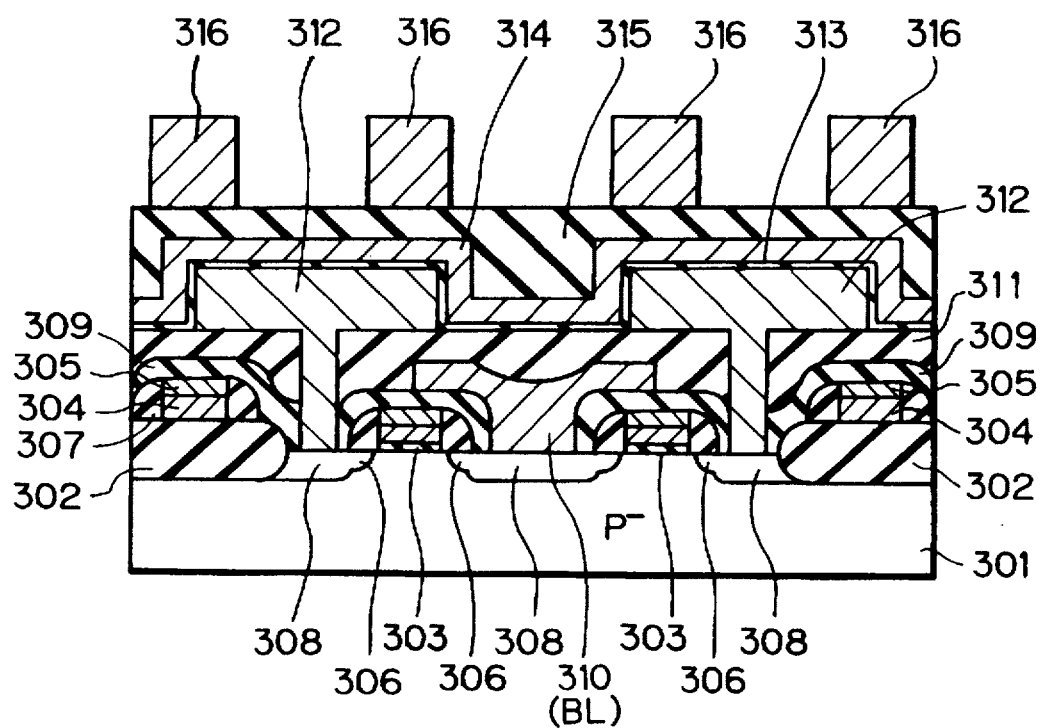
FIG. 4 is a cross-sectional view of the memory cells of FIG. 3.

In FIG. 4, reference numeral 301 designates a $P^{--}$-type monocrystalline silicon substrate. The silicon substrate 301 is partitioned by a field silicon oxide layer 302 which is formed by thermally oxidizing the silicon substrate 301 by using a LCCOS process. Also, a gate silicon oxide layer 303 and a gate electrode (the word line WL) made of a polycrystalline silicon layer 304 and a suicide layer 305 are formed on the silicon substrate 301. Further, $N^-$-type impurity diffusion regions are formed within the silicon substrate 301 in self-alignment with the field silicon oxide layer 302 and the gate electrode.

Sidewall silicon oxide layers 307 are formed on the sidewall of the gate electrode. In this state, $N^+$-type impurity diffusion regions 308 are formed within the silicon substrate 301 in self-alignment with the sidewall silicon oxide layers 307.

An insulating layer 309 made of silicon oxide is formed on the entire surface. Then, a contact hole is perforated in the insulating layer 309, and a bit lines 310 (EL) made of polycrystalline silicon and silicide is formed and is buried in the contact hole of the insulating layer 309.

Also, an insulating layer 311 made of silicon oxide is formed on the entire surface. Then, a contact hole is perforated in the insulating layers 311 and 309, and a capacitor lower electrode layer 312 is formed and is buried in the contant hole of the insulating layers 311 and 309.

Further, a capacitor dielectric layer 313 made of silicon nitride and silicon oxide is formed on the capacitor lower electrode layer 312. Also, formed on the capacitor dielectric layer 313 is a capacitor upper layer 314 made of refractory metal such as TiN or WSi.

Further, an insulating layer 315 is formed on the capacitor upper electrode layer 314, and an aluminum layer 316 is formed on the insulating layer 315.

In the device of FIG. 4, when forming the bit line 310 made of polycrystalline silicon and silicide, i.e., polycide, for reducing the resistance of the bit line 310, and ion implantation process and an annealling (heating) process using nitrogen are carried out. Also, when forming the capacitor lower electrode layer 312 and the capacitor upper electode layer 314, an ion implantation process and an annealling process using nitrogen gas are carred out, or phosphorus ions are thermally doped into polycrystalline silicon. Further, when forming the capapcitor dielectric layer 313, a silicon nitride layer is grown by a chemical vapor deposition (CVD) process at a temperature of about 850° C. Therefore, a plurality of heating processes are carried out before the formation of the aluminum layer 316.

Thus, if the logic circuit device of FIG. 1 and the DRAM device of FIG. 4 are formed on the same silicon substrate, manufacturing processes are mainly dependent upon the manufacturing processes of the DRAM device of FIG. 4, and the number of manufacturing steps is increased, which increases the manufacturing cost. Also, since a plurality of heating processes for the DRAM device of FIG. 4 are required after the formation of the salicide layer 107 of FIG. 1, the salicide layer 107 is agglomerated, which increases the sheet resistance of the salicide layer 107.

FIGS. 5A through 5E are cross-sectional views for explaining a first embodiment of the method for manufacturing a semiconductor device incorporating a DRAM section and a logic circuit section according to the present invention.

Figure 5A:
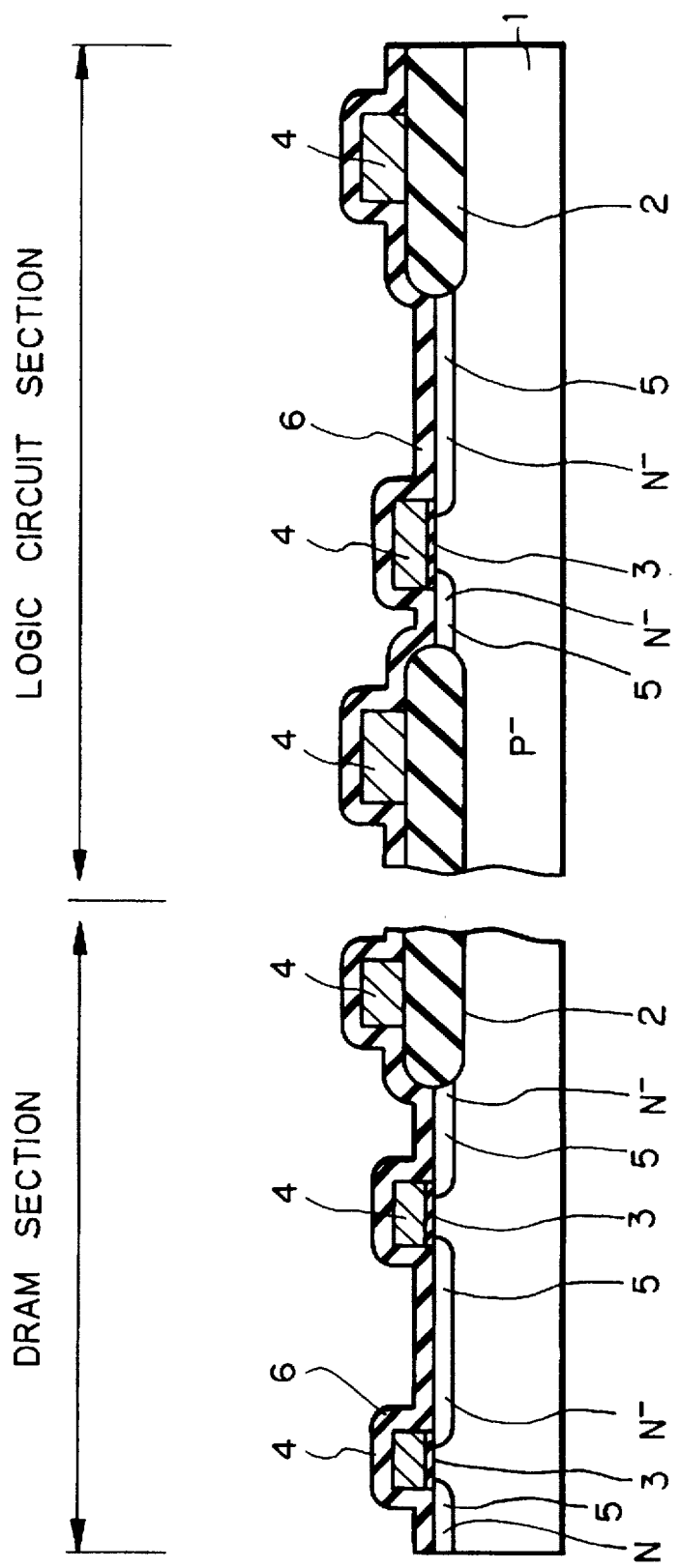

First, referring to FIG. 5A, a $P^-$-type monocrystalline silicon substrate 1 is oxidized by a LOCOS process to form a field silicon oxide layer 2 thereon. Thus, element forming areas are isolated by the field silicon oxide layer 2. Then, a gate silicon oxide layer 3 is formed by thermally oxidizing the silicon substrate 1. Then, gate electrodes 4 made of polycrystalline silicon are formed by a CVD process. In this case, the gate electrodes 4 in the DRAM section serve as word lines. Then, N-type impurity ions such as phosphorus ions are implanted into the silicon substrate 1, so that $N^-$-type impurity diffusion regions 5 are formed within the silicon substrate 1 in self-alignment with the field silicon oxide layer 2 and the gate electrodes 4. Then, an insulating layer 6 made of silicon oxide is formed on the entire surface.

Figure 5B:
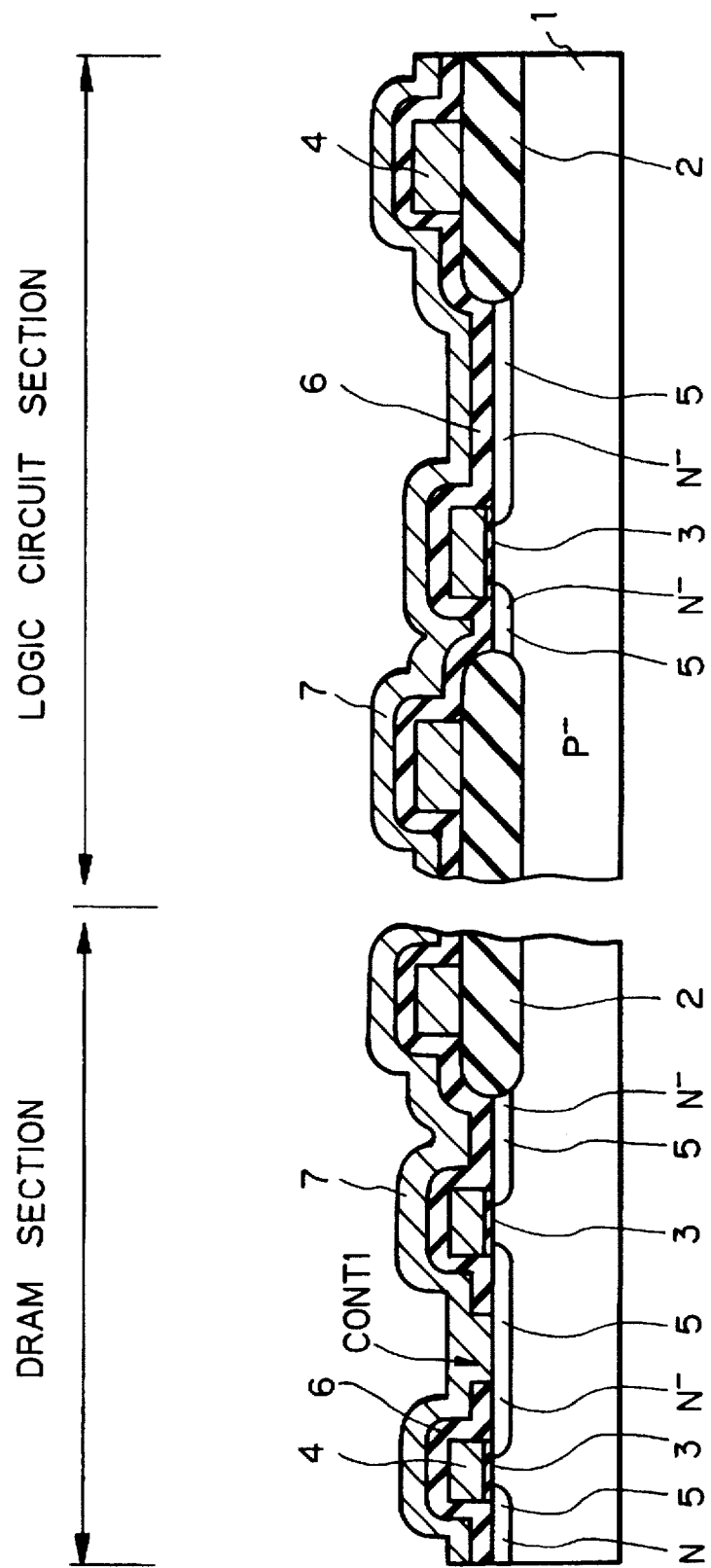

Next, referring to FIG. 5B, a contact hole CONT1 is perforated in the insulating layer 6 in the DRAM section. Then, an about 100 nm thick polycrystalline silicon layer 7 is deposited by a CVD process.

Figure 5C:
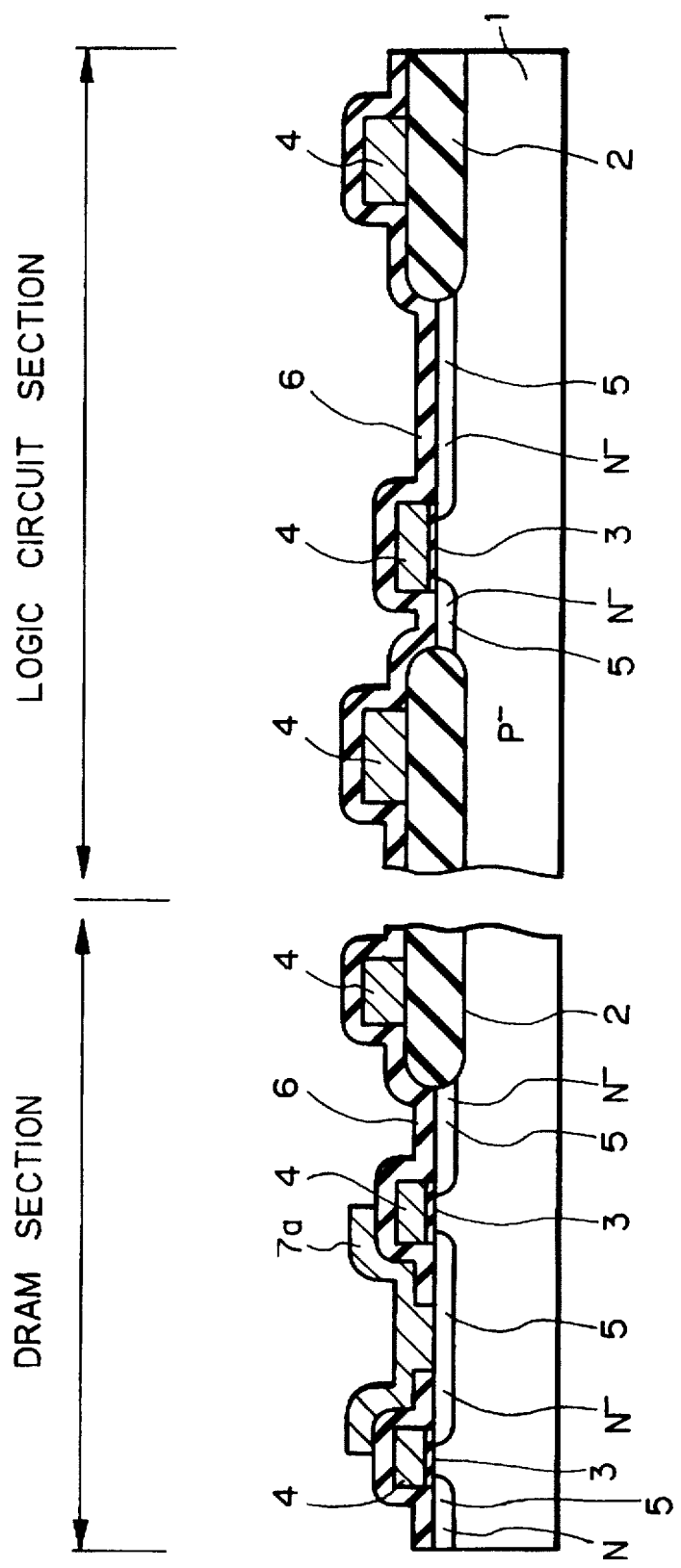

Next, referring to FIG. 5C, the polycrystalline silicon layer 7 is patterned by using a photolithography process and a dry etching process to form a bit line layer 7a. In this case, the polycrystalline silicon layer 7 in the logic layer 7 in the logic circuit section is removed.

Figure 5D:
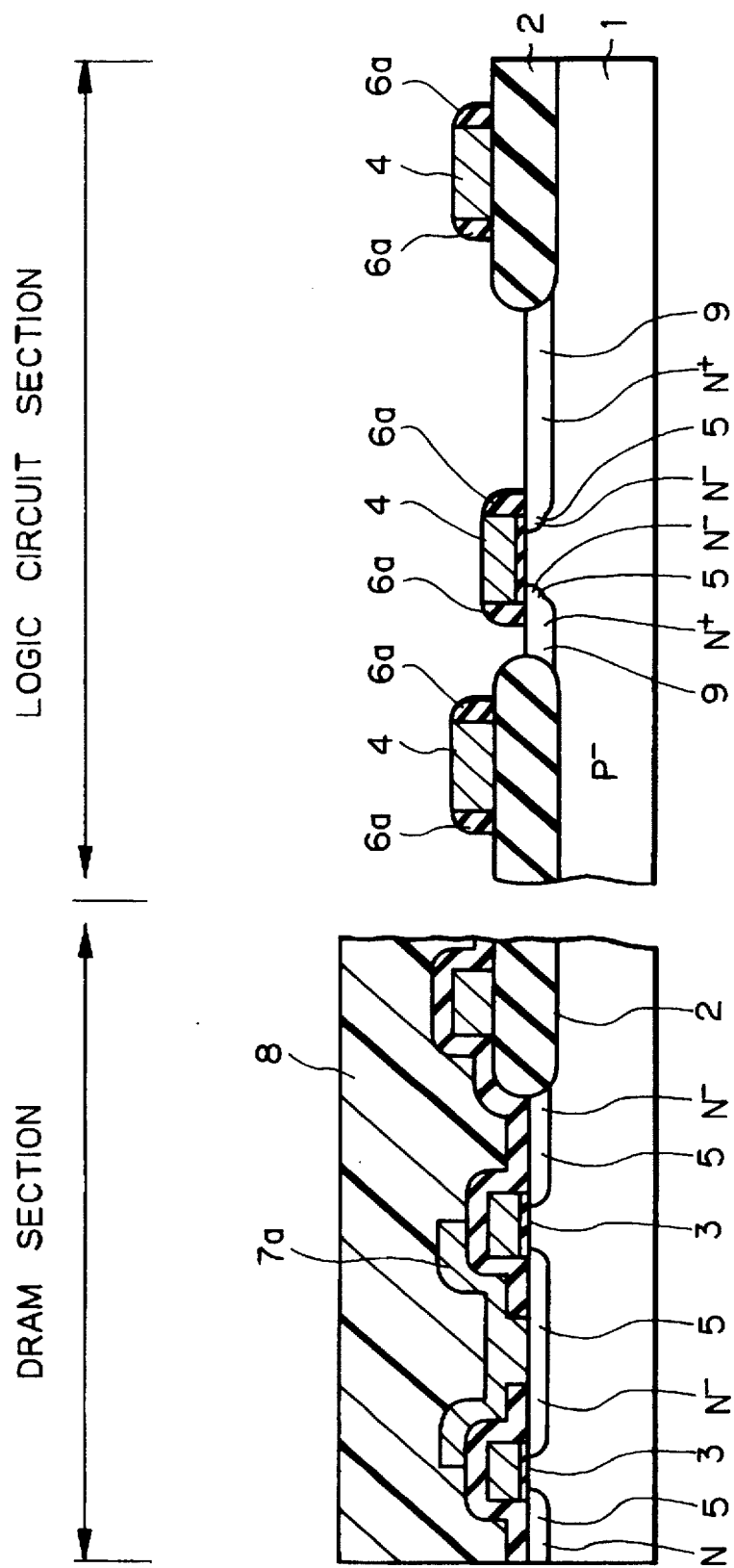

Next, referring to FIG. 5D, the DRAM section is covered by a photoresist pattern layer 8. Then, the insulating layer 6 in the logic circuit section is etched back, so that sidewall insulating layers 6a are formed on sidewalls of the gate electrodes 4 in the logic circuit section. Then, N-type impurity ions such as arsenic ions are implanted into silicon substrate 1, so that $N^+$-type impurity diffusion regions 9 are formed within the silicon substrate 1 in self-alignment with the field silicon oxide layer 2, the gate electrodes 4 and the sidewall-insulating layers 6a. Then, the photoresist pattern layer 8 is removed. Then, an annealling operation using nitrogen gas is performed upon the impurity diffusion regions 5 and 9, to thereby activate and diffuse the ions therein.

Figure 5E:
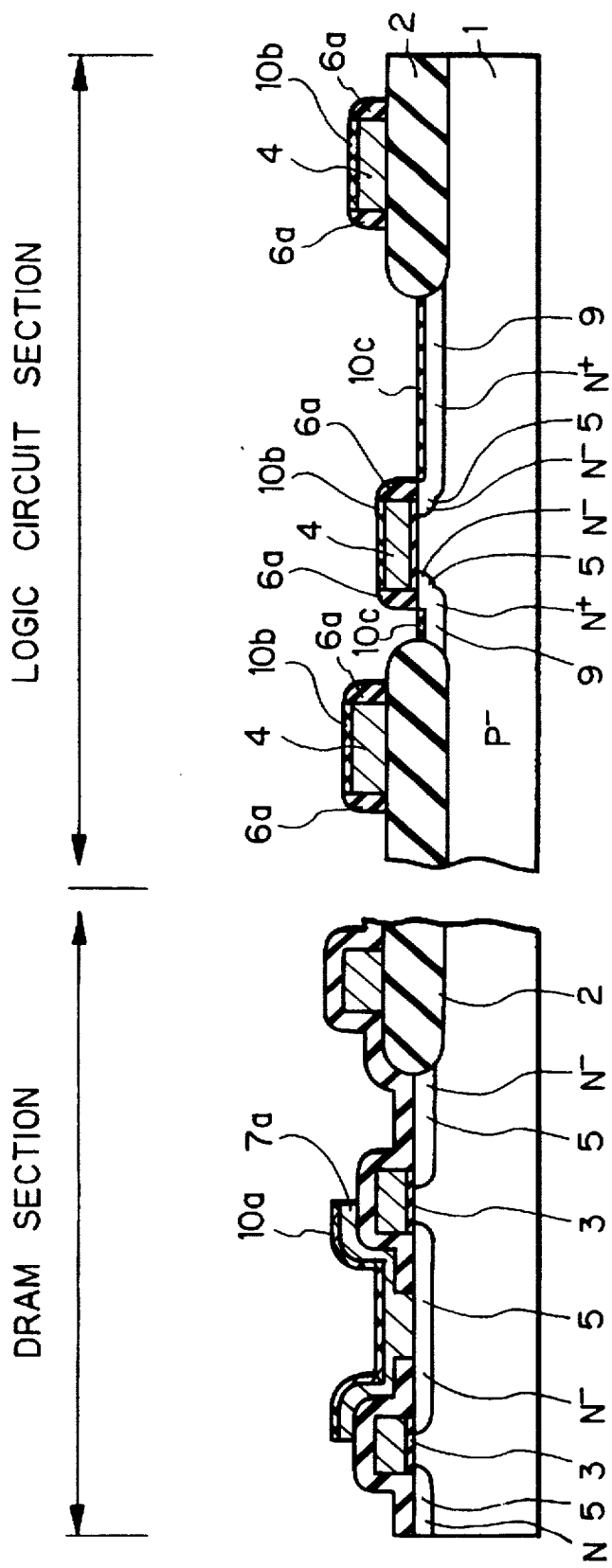

Next, referring to FIG. 5E, about $5 \times 10^{14}$ arsenic ions/cm are implanted into the entire surface of the device. Then, an about 40 nm thick titanium (Ti) layer (not shown) is deposited by a sputtering process or a CVD process, and is annealled in a nitrogen atmosphere at a temperature of about 650° C. As a result, the Ti layer is reacted with the bit line layer 7a in the DRAM section, and the gate electrodes 4 and the $N^+$-type impurity diffusion regions 9 of the logic circuit section, so that titanium silicide (salicide) layers 10a, 10b and 10c are formed in self-alignment with the bit line layer 7a, the gate electrodes 4 and the $N^+$-type impurity diffusion regions 9. Then, unreacted portions of the Ti layer are removed by a wet etching process using hydrogen peroxide water. Then, another annealling operation using nitrogen gas is carried out to create phase transition of TiSi, which reduces the resistance of the salicide layers 10a, 10b and 10c.

Next, referring to FIG. 5F, an insulating layer 11 made of silicon oxide is formed on the entire surface, and the insulating layer 11 is flattened by a chemical mechanical polishing (CMP) process or an etching back process after coating silica. Then, a contact hole CONT2 is perforated in the insulating layer 11 of the DRAM section. Then, a TiN (or Ti) barrier layer 12 is deposited by a sputtering process on the entire surface, and a tungsten (W) layer 13 is deposited on the barrier layer 12 by a CVD process or the like. Then, the w layer 13 and the barrier layer 12 are patterned to form a capacitor lower electrode layer.

Then, an about 10 nm thick tantalum oxide ($Ta_2O_5$) layer is deposited by a CVD process, and is exposed to oxygen plasma, to form a capacitor dielectric layer 14.

Then, a TiN layer or a TiN/WSi layer is deposited by a sputtering process to form an capacitor upper electrode layer 15.

The capacitor upper electrode layer 15 and the capacitor dielectric layer 14 are patterned by a photolithography process and an etching process.

Figure 5G:
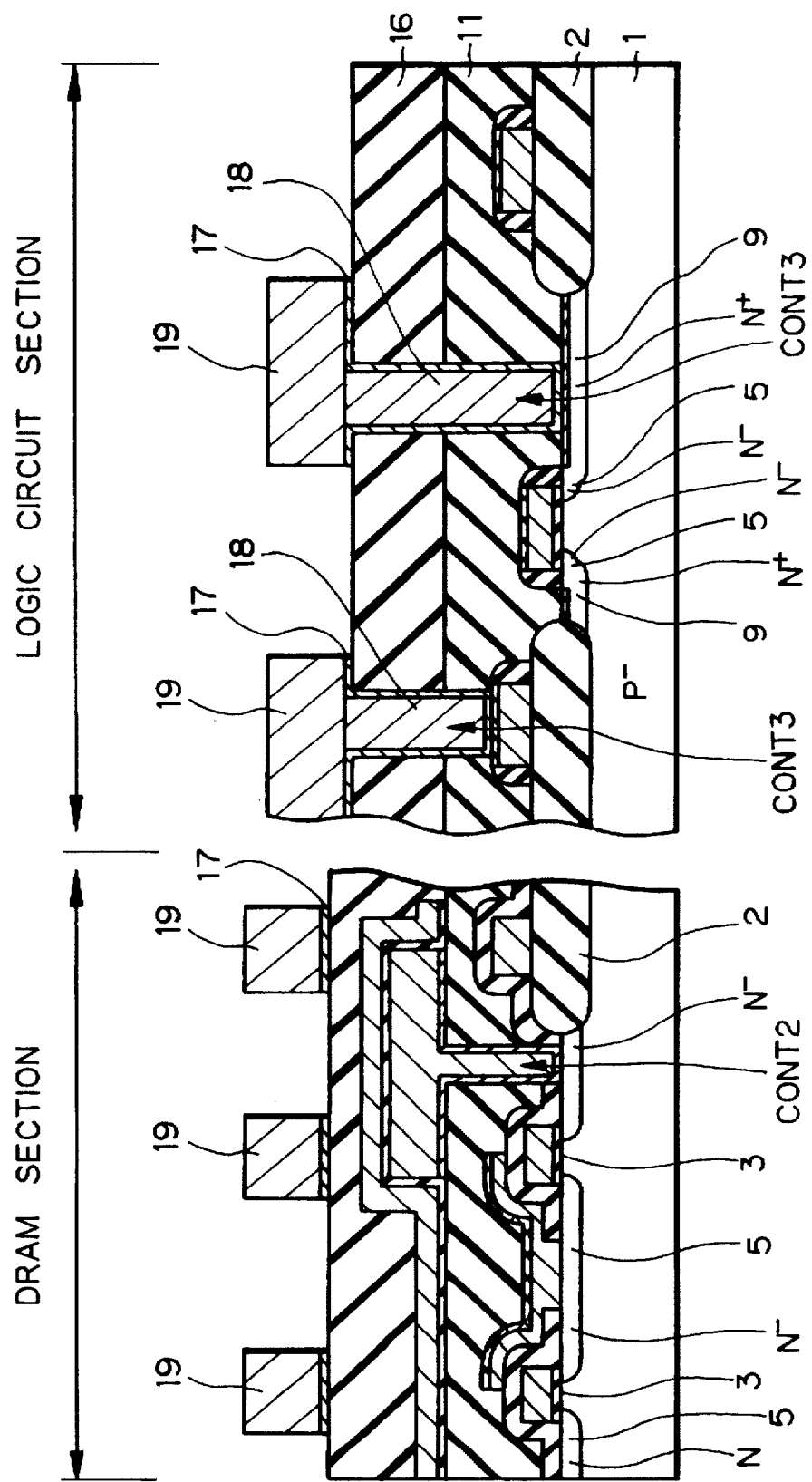

Finally, referring to FIG. 5G, an insulating layer 16 made of silicon oxide or the like is formed and is flattened. Then, contact holes CONT3 are perforated in the insulating layers 16 and 11 of the logic circuit section. In this case, contact holes (not shown) are perforated in the insulating layers of peripheral circuit portions of the DRAM section.

Then, a TiN (or Ti) barrier layer 17 is deposited by a sputtering process on the entire surface. In addition, a W layer is formed by a CVD process and is etched back to form contact structures 18 buried in the contact holes CONT3. Also, an aluminum layer 19 is formed, and the aluminum layer 19 as well as the barrier layer 17 is patterned. Subsequently, a plurality of other aluminum layers as illustrated in FIG. 1 are formed to complete the device.

Thus, in the first embodiment, since the bit line layer of the DRAM section becomes salicide simultaneously when the impurity regions of the logic circuit section become salicide, an annealing (heating) operation for the bit lines which was required in the prior art, is unnecessary, which can suppress the agglomeration of the salicide layers 10a, 10b and 10c. Also, the manufacturing steps can be reduced. Further, since the capacitor electrodes are made of metal, not polycrystalline silicon, and the capacitor dielectric layer is made of $Ta_2O_5$, the temperature at the post stages of the formation of salicide can be lower than 700° C., so that the agglomeration of salicide can be suppressed.

FIGS. 6A through 6H are cross-sectional views for explaining a second embodiment of the method for manufacturing a semiconductor device incorporating a DRAM section and a logic circuit section according to the present invention.

Figure 6A:
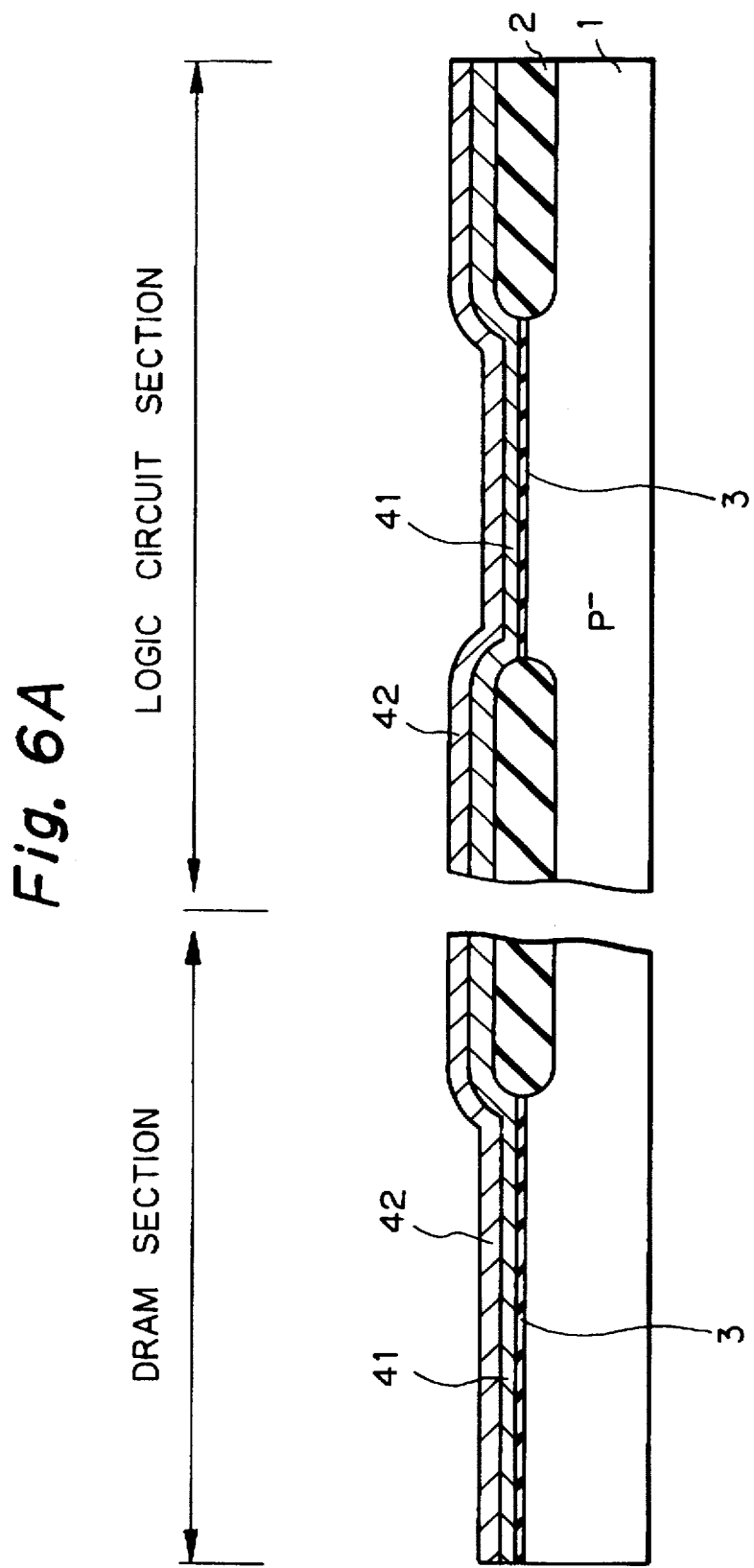

First, referring to FIG. 6A, a $P^-$-type monocrystalline silicon substrate 1 is oxidized by a LOCOS process to form a field silicon oxide layer 2 thereon. Thus, element forming areas are isolated by the field silicon oxide layer 2. Then, a gate silicon oxide layer 3 is formed by thermally oxidizing the silicon substrate 1. Then, a polycrystalline silicon layer 41 is deposited by a CVD process on the entire surface, and also, a silicide layer 41 made of WSi or the like is deposited by a sputtering process on the polycrystaline silicon layer 41. That is, the silicide layer 42 and the polycrystalline silicon layer 41 constitute a polycide layer.

Figure 6B:
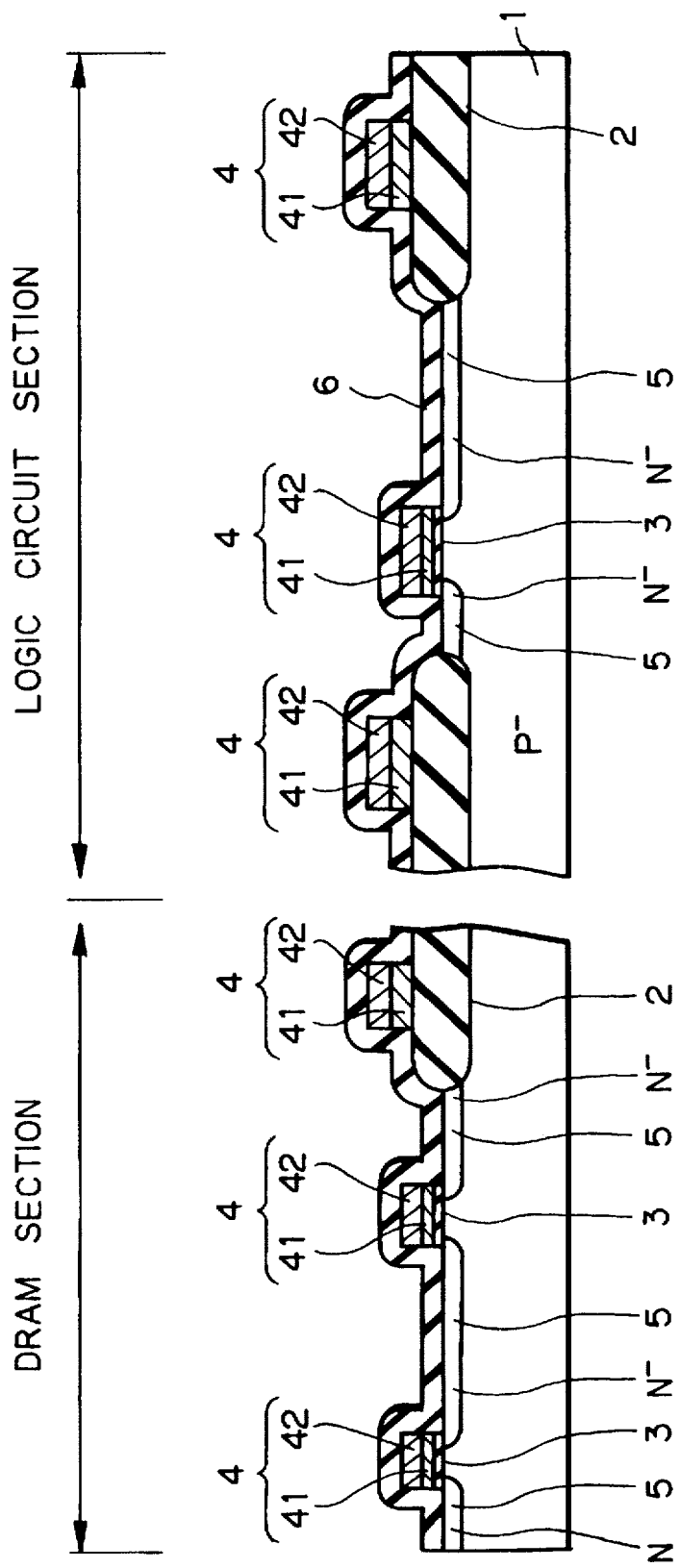

Next, referring to FIG. 6B, the polycide layer (42, 41) is etched to form gate electrodes 4. In this case, the gate electrodes 4 in the DRAM section serve as word lines. Then, in the same way as in FIG. 5A, N-type impurity ions such as phosphorus ions are implanted into the silicon substrate 1, so that $N^-$-type impurity diffusion regions 5 are formed within the silicon substrate 1 in self-alignment with the field silicon oxide layer 2 and the gate electrodes 4. Then, an insulating layer 6 made of silicon oxide is formed on the entire surface.

Figure 6C:
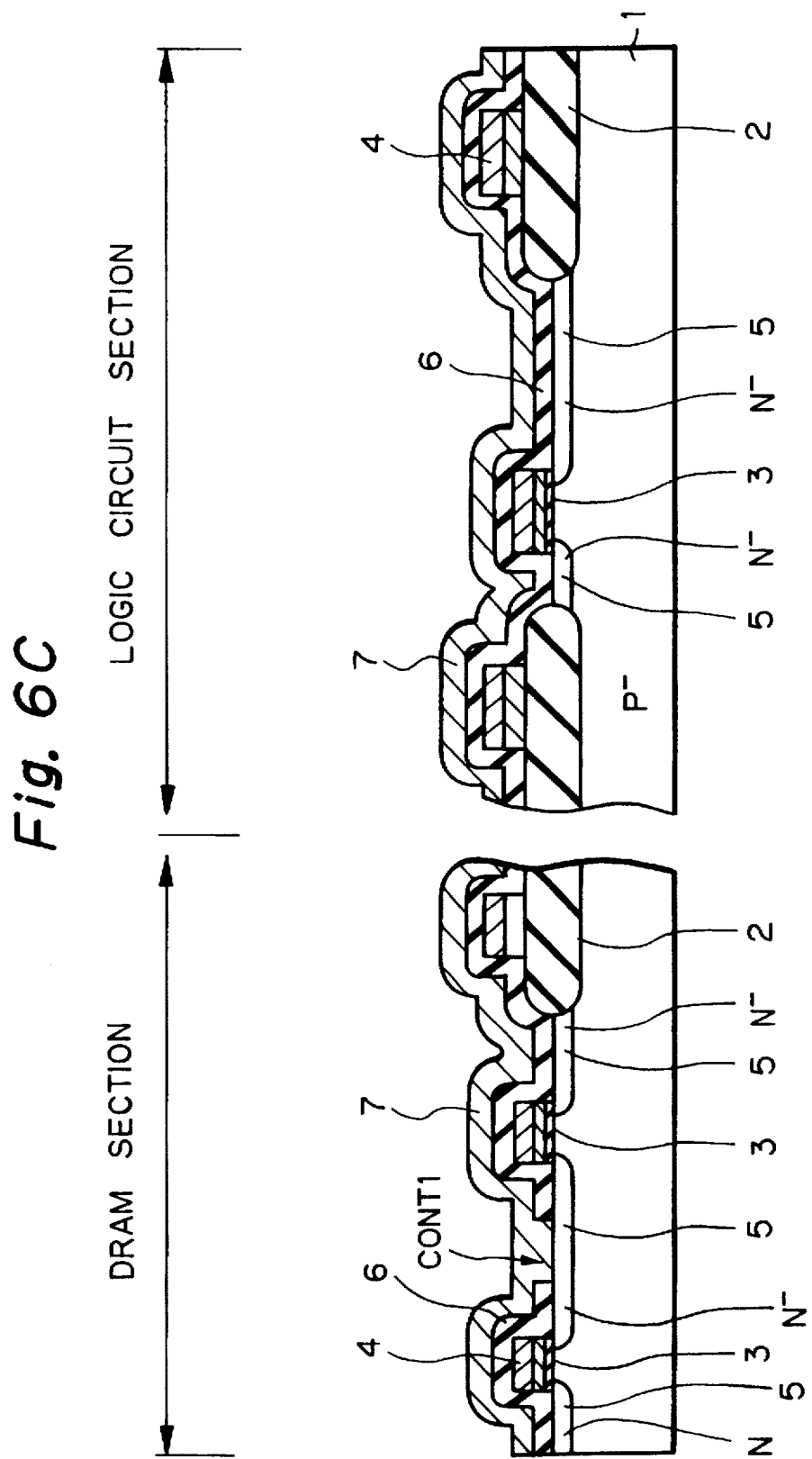

Next, referring to FIG. 6C, in the same way as in FIG. 5B, a contact hole CONT1 is perforated in the insulating layer 6 in the DRAM section. Then, an about 100 nm thick polycrystalline silicon layer 7 is deposited by a CVD process.

Figure 6D:
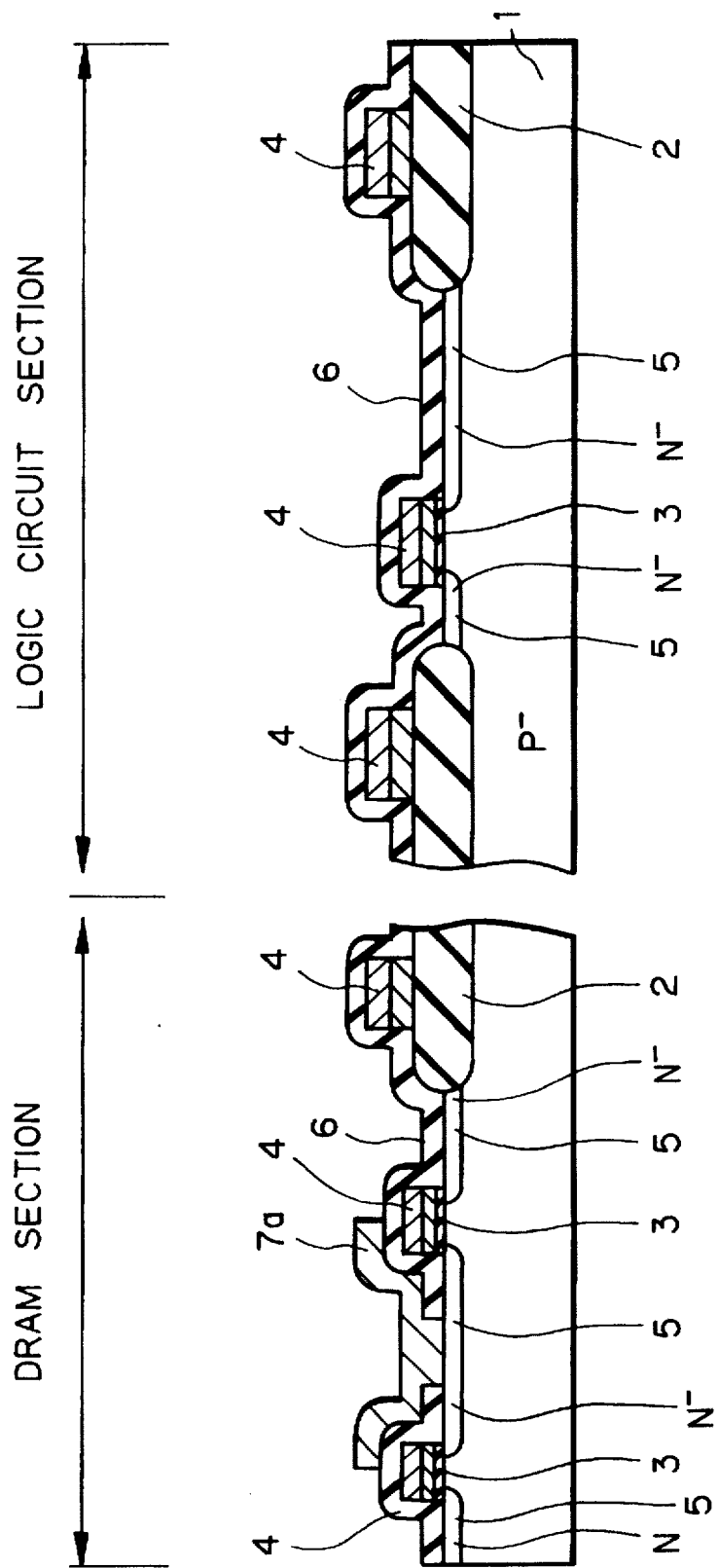

Next, referring to FIG. 6D, in the same way as in FIG. 5C, the polycrystalline silicon layer 7 is patterned by using a photolithography process and a dry etching process to form a bit line layer 7a. In this case, the polycrystalline silicon layer 7 in the logic layer 7 in the logic circuit section is removed.

Figure 6E:
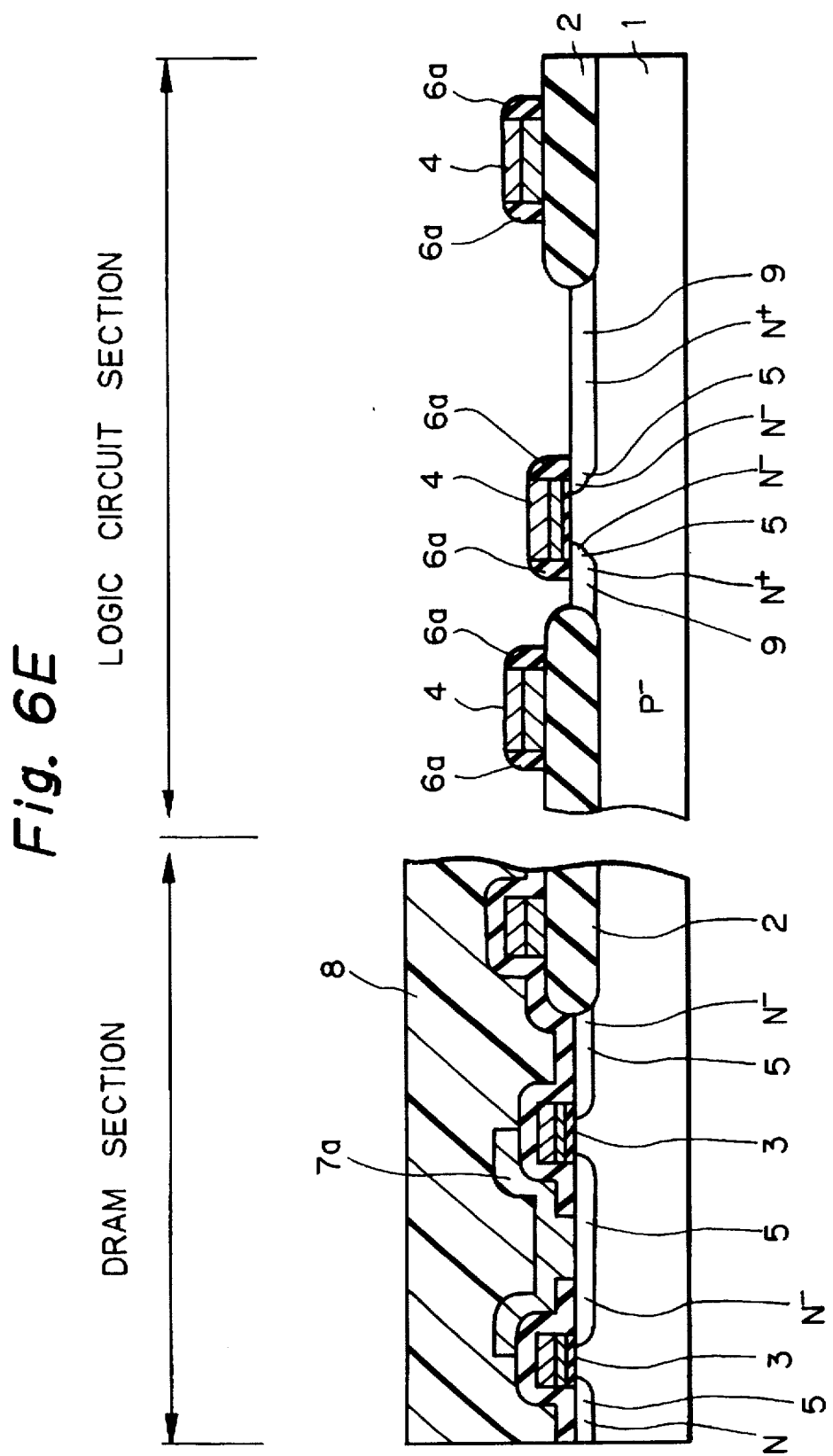

Next, referring to FIG. 6E, in the same way as in FIG. 5D, the DRAM section is covered by a photoresist pattern layer 8. Then, the insulating layer 6 in the logic circuit section is etched back, so that sidewall insulating layers 6a are formed on sidewalls of the gate electrodes 4 in the logic circuit section. Then, N-type impurity ions such as arsenic ions are implanted into silicon substrate 1, so that N⁺-type impurity diffusion regions 9 are formed within the silicon substrate 1 in self-alignment with the field silicon oxide layer 2, the gate electrodes 4 and the sidewall insulating layers 6a. Then, the photoresist pattern layer 8 is removed. Then, an annealling operation using nitrogen gas is performed upon the impurity diffusion regions 5 and 9, to thereby activate and diffuse the ions therein.

Figure 6F:
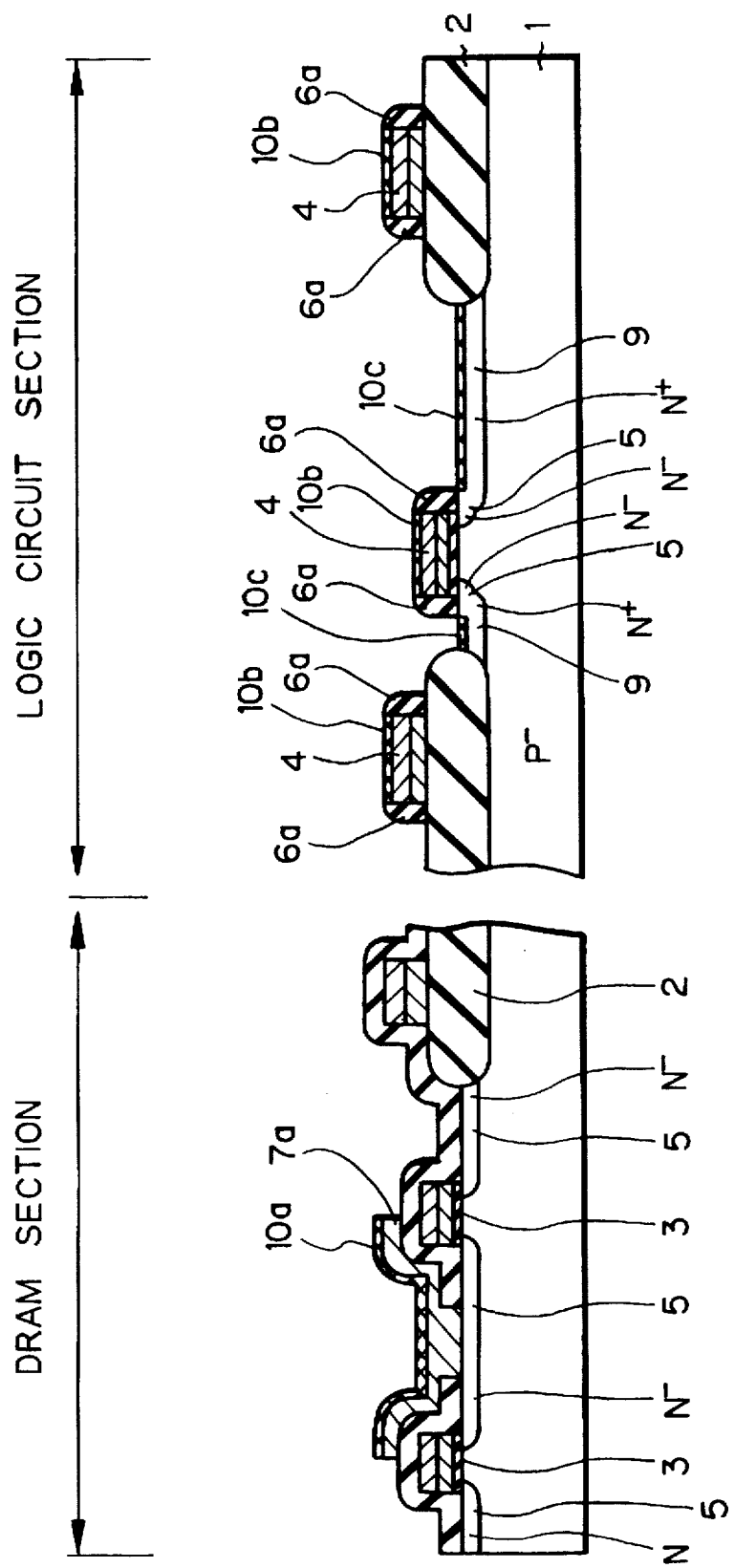

Next, referring to FIG. 6F, in the same way as in FIG. 5E, about 5×10¹⁴ arsenic ions/cm are implanted into the entire surface of the device. Then, an about 40 nm thick titanium (Ti) layer (not shown) is deposited by a sputtering process or a CVD process, and is annealed in a nitrogen atmosphere at a temperature of about 650° C. As a result, the Ti layer is reacted with the bit line layer 7a in the DRAM section, and the gate electrodes 4 and the N⁺-type impurity diffusion regions 9 of the logic circuit section, so that titanium silicide (salicide) layers 10a, 10b and 10c are formed in self-alignment with the bit line layer 7a, the gate electrodes 4 and the N⁺-type impurity diffusion regions 9. Then, unreacted portions of the Ti layer are removed by a wet etching process using hydrogen peroxide water. Then, another annealing operation using nitrogen gas is carried out to create phase transition of TiSi, which reduces the resistance of the salicide layers 10a, 10b and 10c.

Figure 6G:
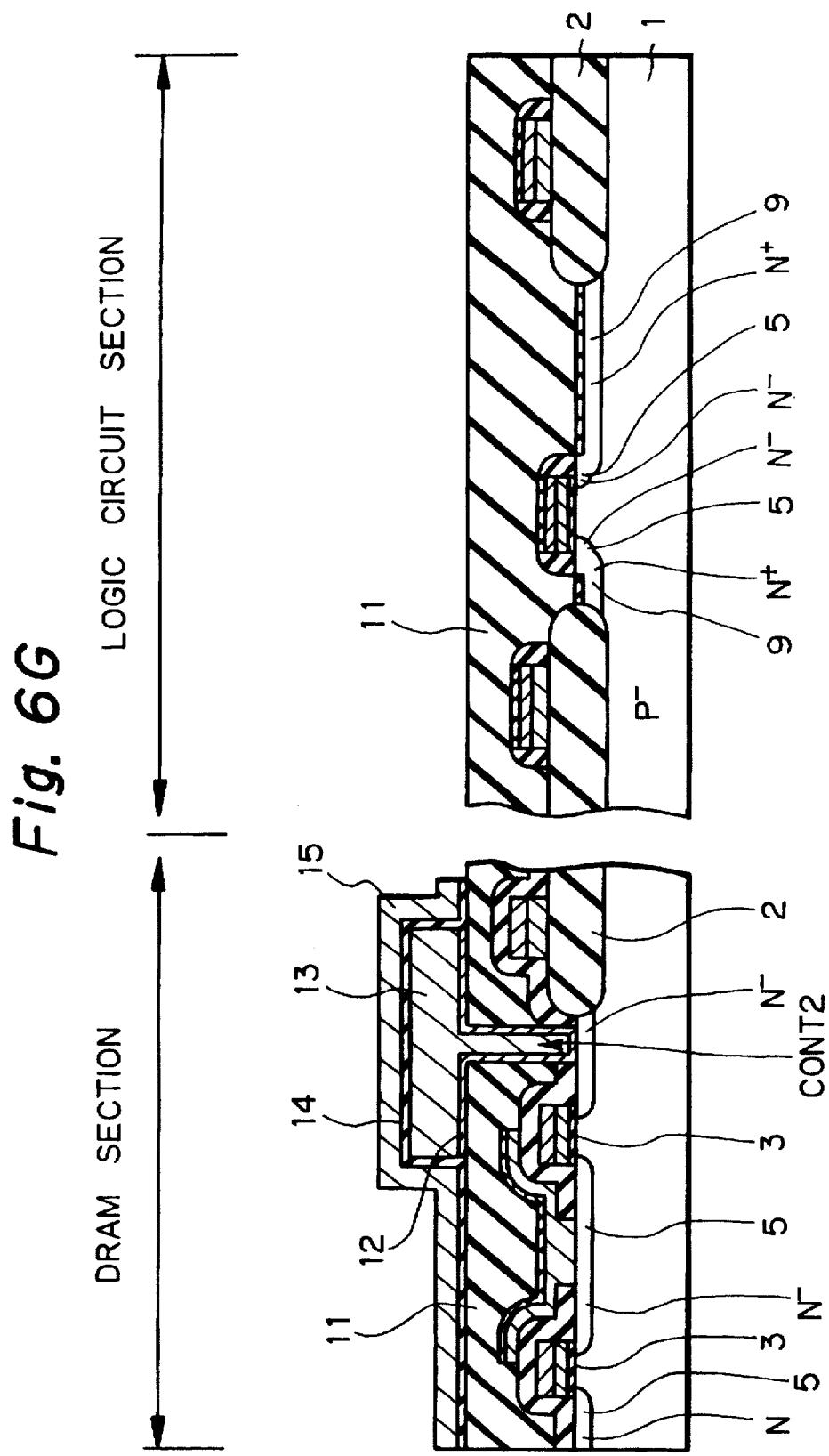

Next, referring to FIG. 6G, in the same way as in FIG. 5F, an insulating layer 11 made of silicon oxide is formed on the entire surface, and the insulating layer 11 is flattened by a CMP process or an etching back process after coating silica. Then, a contact hole CONT2 is perforated in the insulating layer 11 of the DRAM section. Then, a TiN (or Ti) barrier layer 12 is deposited by a sputtering process on the entire surface, and a tungsten (W) layer 13 is deposited on the barrier layer 12 by a CVD process or the like. Then, the w layer 13 and the barrier layer 12 are patterned to form a capacitor lower electrode layer.

Then, an about 10 nm thick Ta₂O₅ layer is deposited by a CVD process, and is exposed to oxygen plasma, to form a capacitor dielectric layer 14.

Then, a TiN layer or a TiN/WSi layer is deposited by a sputtering process to form an capacitor upper electrode layer 15.

The capacitor upper electrode layer 15 and the capacitor dielectric layer 14 are patterned by a photolithography process and an etching process.

Finally, referring to FIG. 6H, in the same way as in FIG. 5G, an insulating layer 16 made of silicon oxide or the like is formed and is flattened. Then, contact holes CONT3 are perforated in the insulating layers 16 and 11 of the logic circuit section. In this case, contact holes (not shown) are perforated in the insulating layers of peripheral circuit portions of the DRAM section.

Then, a TiN (or Ti) barrier layer 17 is deposited by a sputtering process on the entire surface. In addition, a W layer is formed by a CVD process and is etched back to form contact structures 18 buried in the contact holes CONT3. Also, an aluminum layer 19 is formed, and the aluminum layer 19 as well as the barrier layer 17 is patterned. Subsequently, a plurality of other aluminum layers as illustrated in FIG. 1 are formed to complete the device.

In the second embodiment, in addition to the effect of the first embodiement, since the gate electrodes are of a polycide structure, the resistance thereof can be further reduced.

FIGS. 7A through 7I are cross-sectional views for explaining a third embodiment of the method for manufacturing a semiconductor device incorporating a DRAM section and a logic circuit section according to the present invention.

Figure 7A:
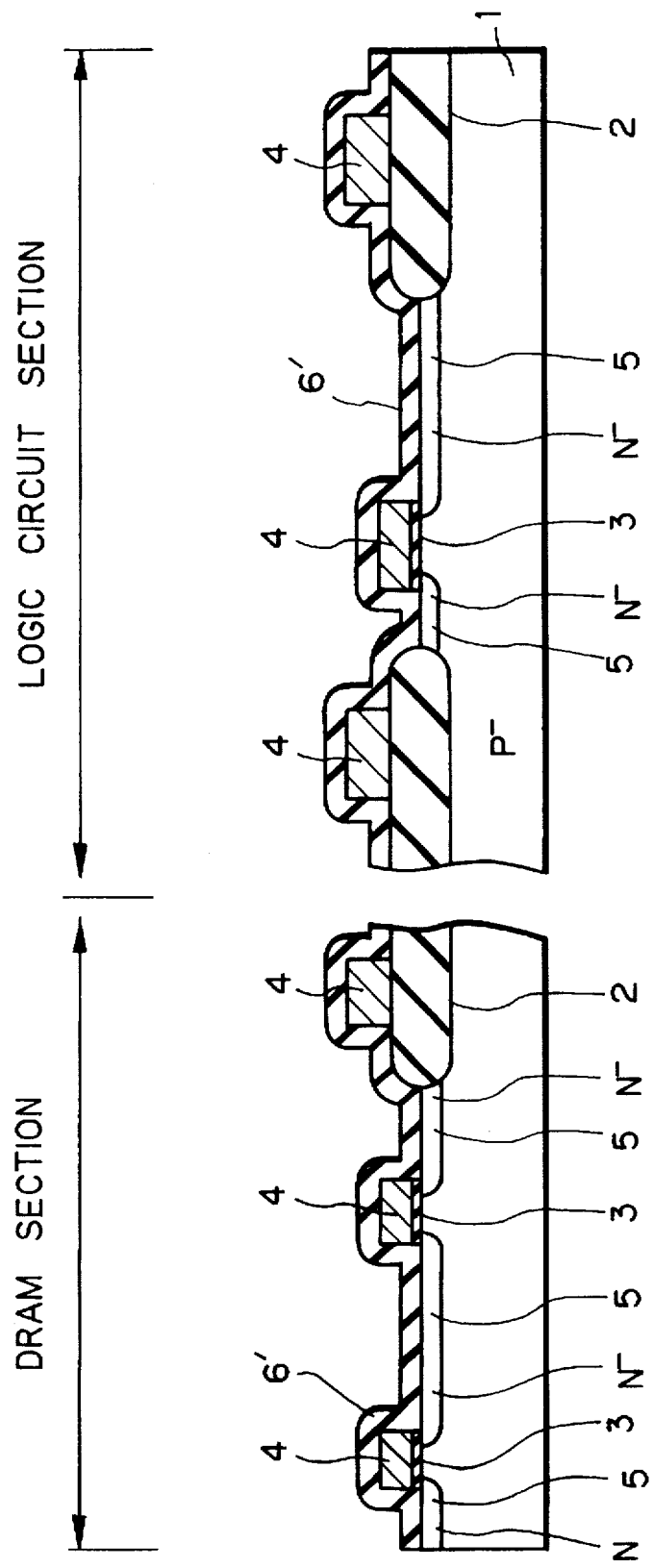

First, referring to FIG. 7A, in the same way as in FIG. 5A, a P⁻-type monocrystalline silicon substrate 1 is oxidized by a LOCOS process to form a field silicon oxide layer 2 thereon. Thus, element forming areas are isolated by the field silicon oxide layer 2. Then, a gate silicon oxide layer 3 is formed by thermally oxidizing the silicon substrate 1. Then, gate electrodes 4 made of polycrystalline silicon are formed by a CVD process. In this case, the gate electrodes 4 in the DRAM section serve as word lines. N-type impurity ions such as phosphorus ions are implanted into the silicon substrate 1, so that N⁻-type impurity diffusion regions 5 are formed within the silicon substrate 1 in self-alignment with the field silicon oxide layer 2 and the gate electrodes 4. Then, an insulating layer 6' made of silicon oxide is formed on the entire surface.

Figure 7B:
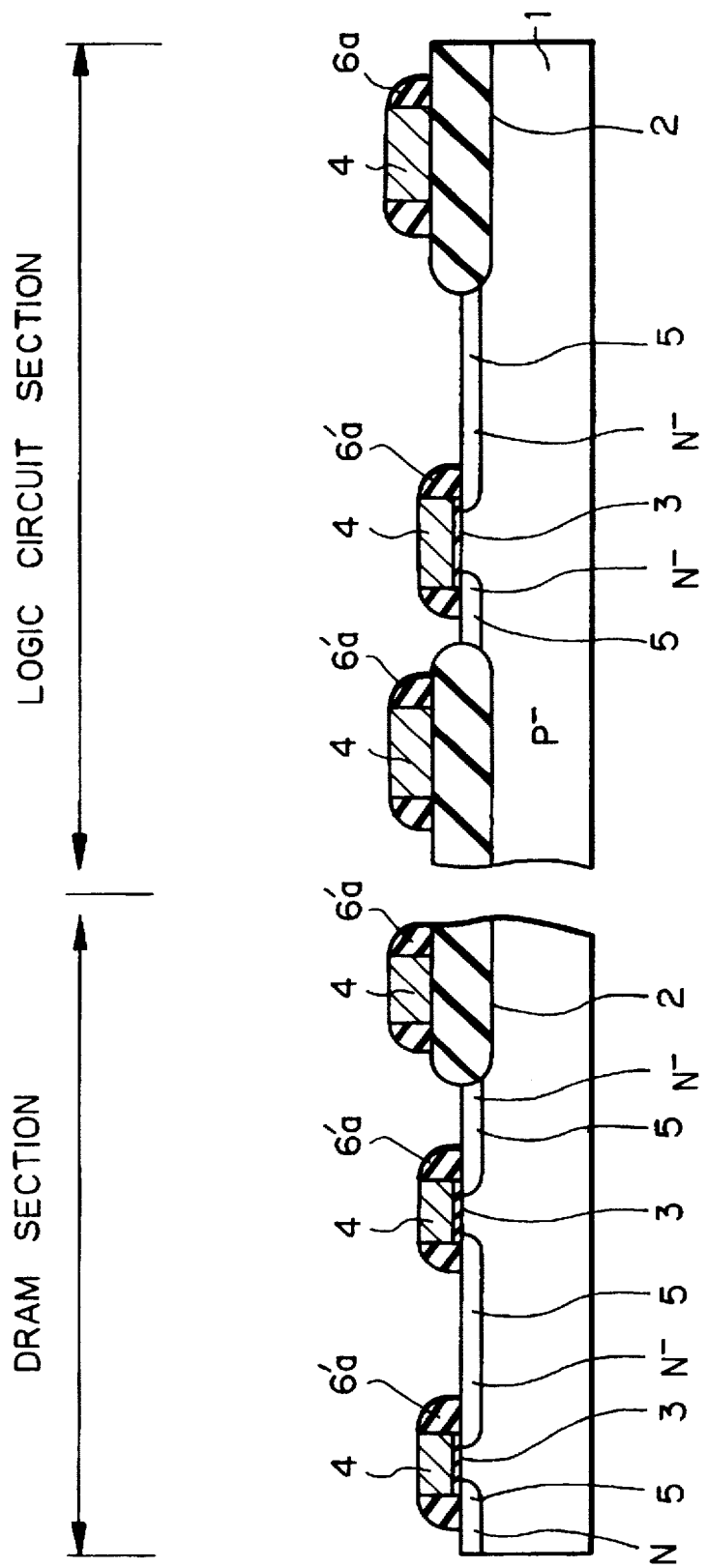

Next, referring to FIG. 7B, the insulating layer 6' is etched back, so that sidewall insulating layers 6a are formed on sidewalls of the gate electrodes 4 both in the DRAM section and the logic circuit section.

Figure 7C:
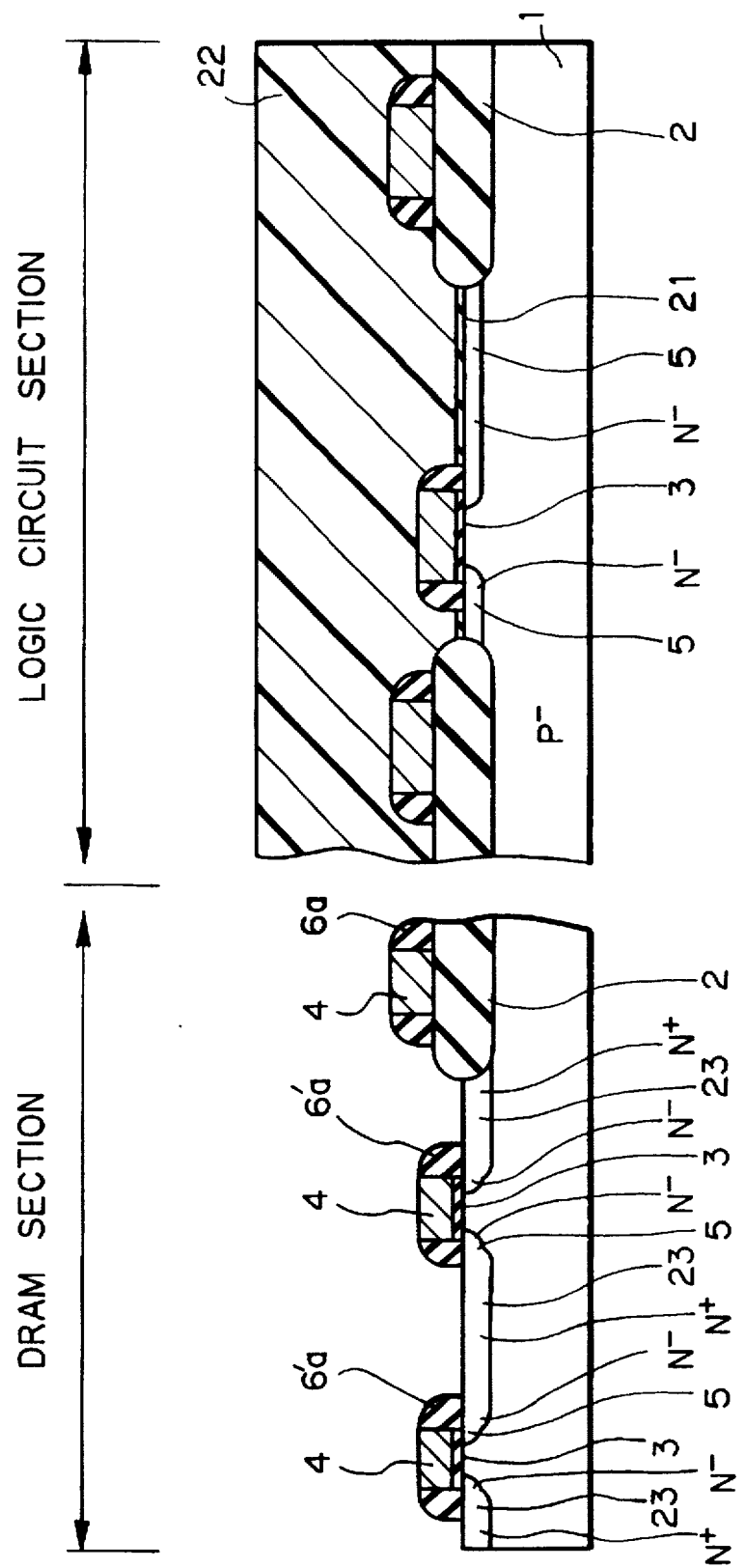

Next, referring to FIG. 7C, a thin silicon oxide layer 21 is formed, and a photoresist pattern layer 22 is formed to cover the logic circuit section. Then, the silicon oxide layer 21 in the DRAM section is etched. Then, N-type impurity ions such as arsenic ions are implanted into the silicon substrate 1, so that N⁺-type impurity diffusion regions 23 are formed in self-alignment with the field silicon oxide layer, the gate electrodes 4 and the sidewall insulating layer 6a. Then, the photoresist pattern layer 22 is removed, and the silicon oxide layer 21 in the logic circuit section is etched.

Figure 7D:
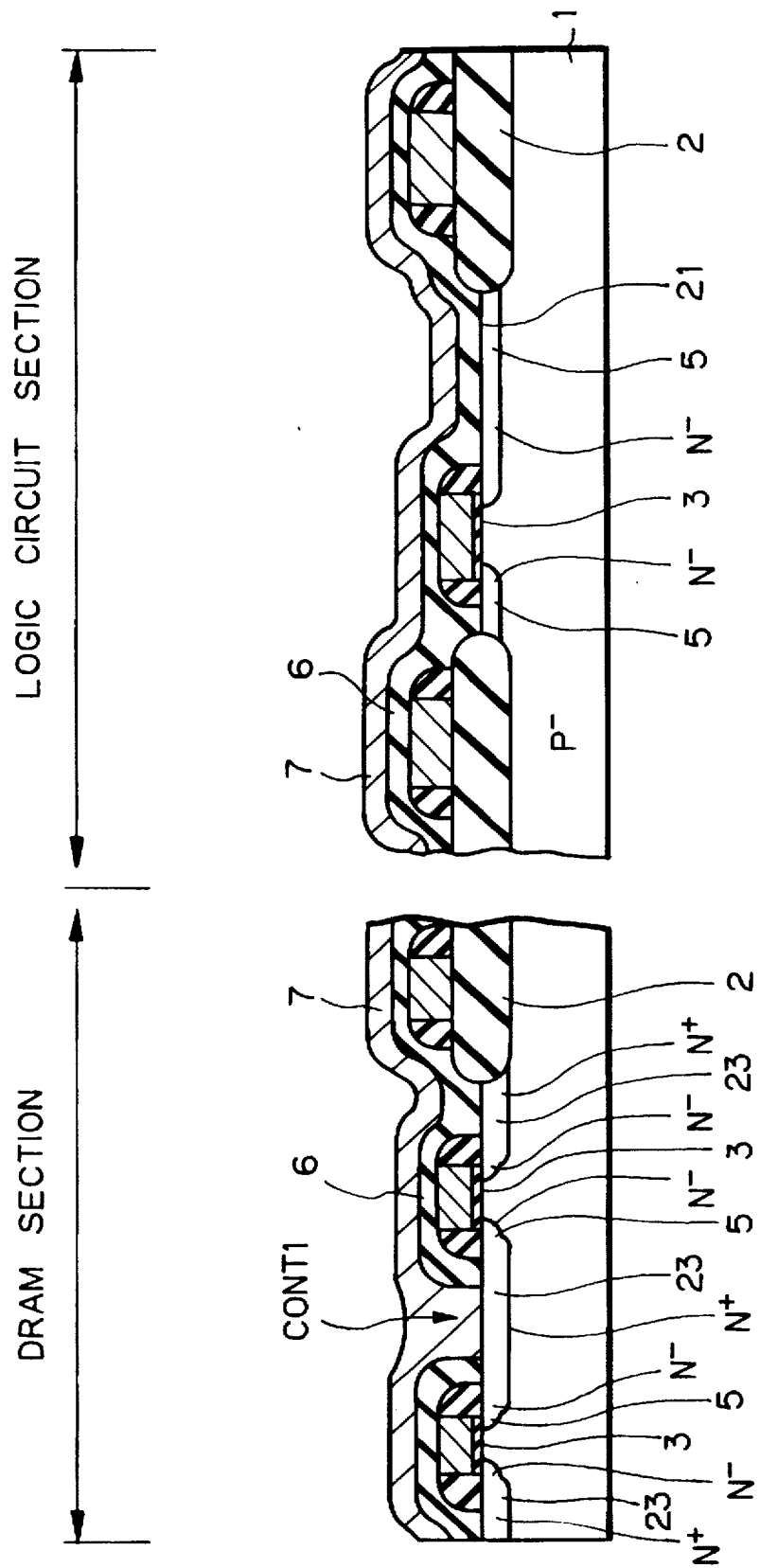

Next, referring to FIG. 7D, an insulating layer 6 made of silicon oxide is formed on the entire surface. Then, in the same way as in FIG. 5B, a contact hole CONT1 is perforated in the insulating layer 6 in the DRAM section. Then, an about 100 nm thick polycrystalline silicon layer 7 is deposited by a CVD process.

Next, referring to FIG. 7E, in the same way as in FIG. 5C, the polycrystalline silicon layer 7 is patterned by using a photolithography process and a dry etching process to form a bit line layer 7a. In this case, the polycrystalline silicon layer 7 in the logic layer 7 in the logic circuit section is removed.

Next, referring to FIG. 7F, in the same way as in FIG. 5D, the DRAM section is covered by a photoresist pattern layer 8. Then, the insulating layer 6 in the logic circuit section is etched back, so that sidewall insulating layers 6a are formed on sidewalls of the gate electrodes 4 in the logic circuit section. Then, N-type impurity ions such as arsenic ions are implanted into silicon substrate 1, so that N⁺-type impurity diffusion regions 9 are formed within the silicon substrate 1 in self-alignment with the field silicon oxide layer 2, the gate electrodes 4 and the sidewall insulating layers 6a. Then, the photoresist pattern layer 8 is removed. Then, an annealling operation using nitrogen gas is performed upon the impurity diffusion regions 5 and 9, to thereby activate and-diffuse the ions therein.

Figure 7G:
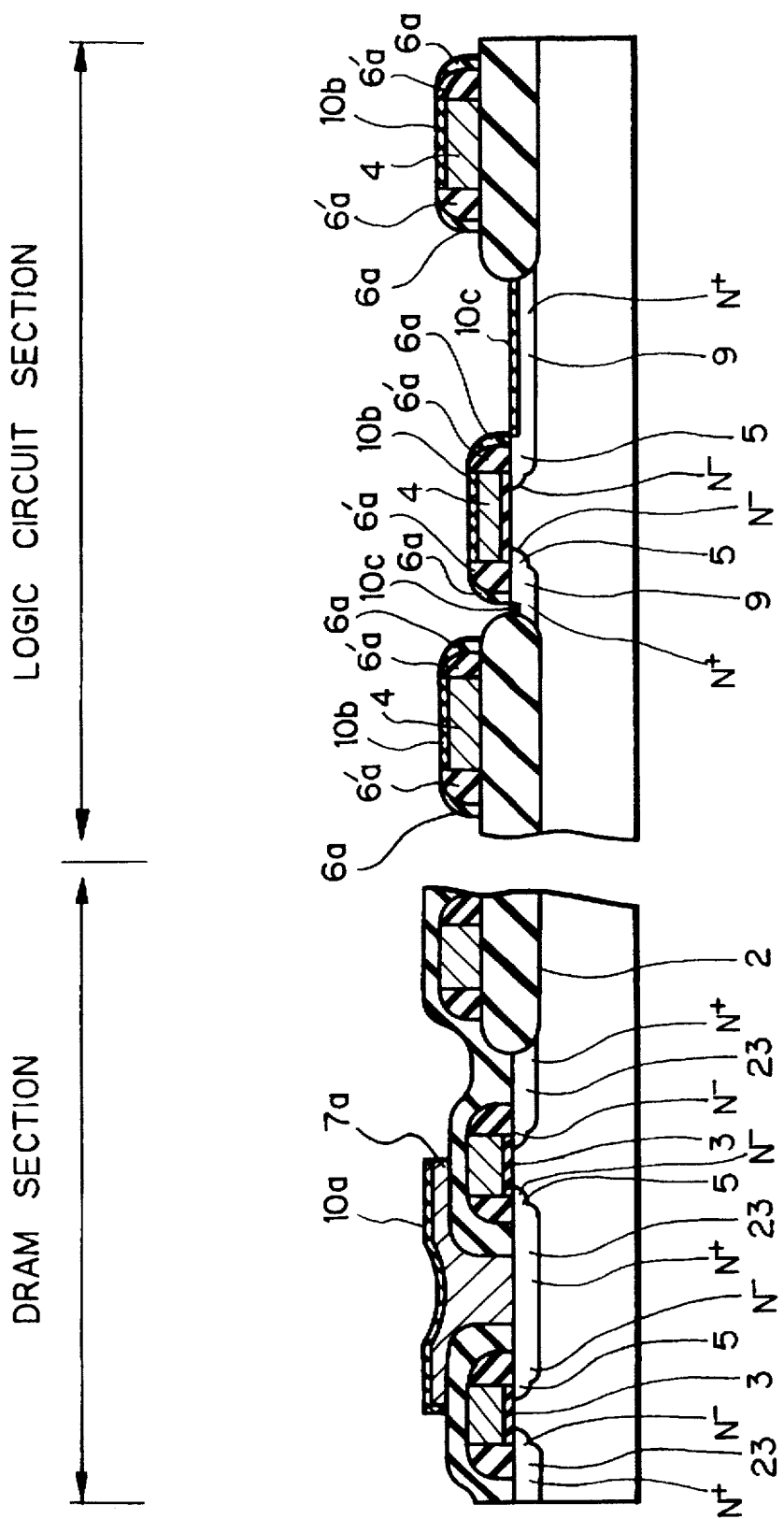

Next, referring to FIG. 7G, in the same way as in FIG. 5E, about 5×10¹⁴, arsenic ions/cm are implanted into the entire surface of the device. Then, an about 40 nm thick titanium (Ti) layer (not shown) is deposited by a sputtering process or a CVD process, and is annealled in a nitrogen atmosphere at a temperature of about 650° C. As a result, the Ti layer is reacted with the bit line layer 7a in the DRAM section, and the gate electrodes 4 and the N⁺-type impurity diffusion regions 9 of the logic circuit section, so that titanium silicide (salicide) layers 10a, 10b and 10c are formed in self-alignment with the bit line layer 7a, the gate electrodes 4 and the N⁺-type impurity diffusion regions 9. Then, unreacted portions of the Ti layer are removed by a wet etching process using hydrogen peroxide water. Then, another annealling opration using nitrogen gas is carried out to create phase transition of TiSi, which reduces the resistance of the salicide layers 10a, 10b and 10c.

Figure 7H:
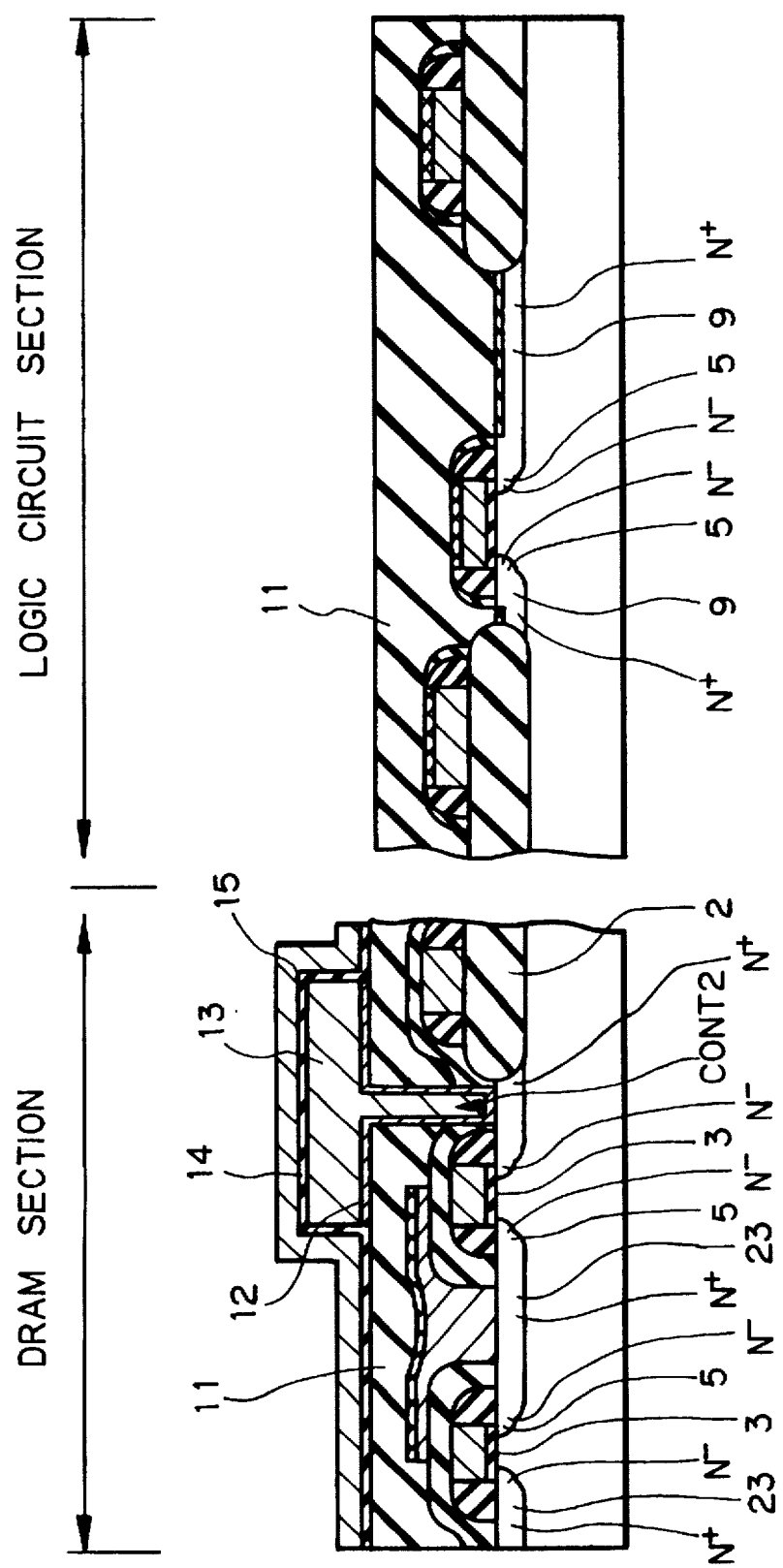

Next, referring to FIG. 7H. in the same way as in FIG. 5F, an insulating layer 11 made of silicon oxide is formed on the entire surface, and the insulating layer 11 is flattened by a chemical mechanical polishing (CMP) process or an etching back process after coating silica. Then, a contact hole CONT2 is perforated in the insulating layer 11 of the DRAM section. Then, a TiN (or Ti) barrier layer 12 is deposited by a sputtering process on the entire surface, and a tungsten (W) layer 13 is deposited on the barrier layer 12 by a CVD process or the like. Then, the W layer 13 and the barrier layer 12 are patterned to form a capacitor lower electrode layer.

Then, an about 10 nm thick $Ta_2O_5$ layer is deposited by a CVD process, and is exposed to oxygen plasma, to form a capacitor dielectric layer 14.

Then, a TiN layer or a TiN/WSi layer is deposited by a sputtering process to form a capacitor upper electrode layer 15.

The capacitor upper electrode layer 15 and the capacitor dielectric layer 14 are patterned by a photolithography process and an etching process.

Figure 7I:
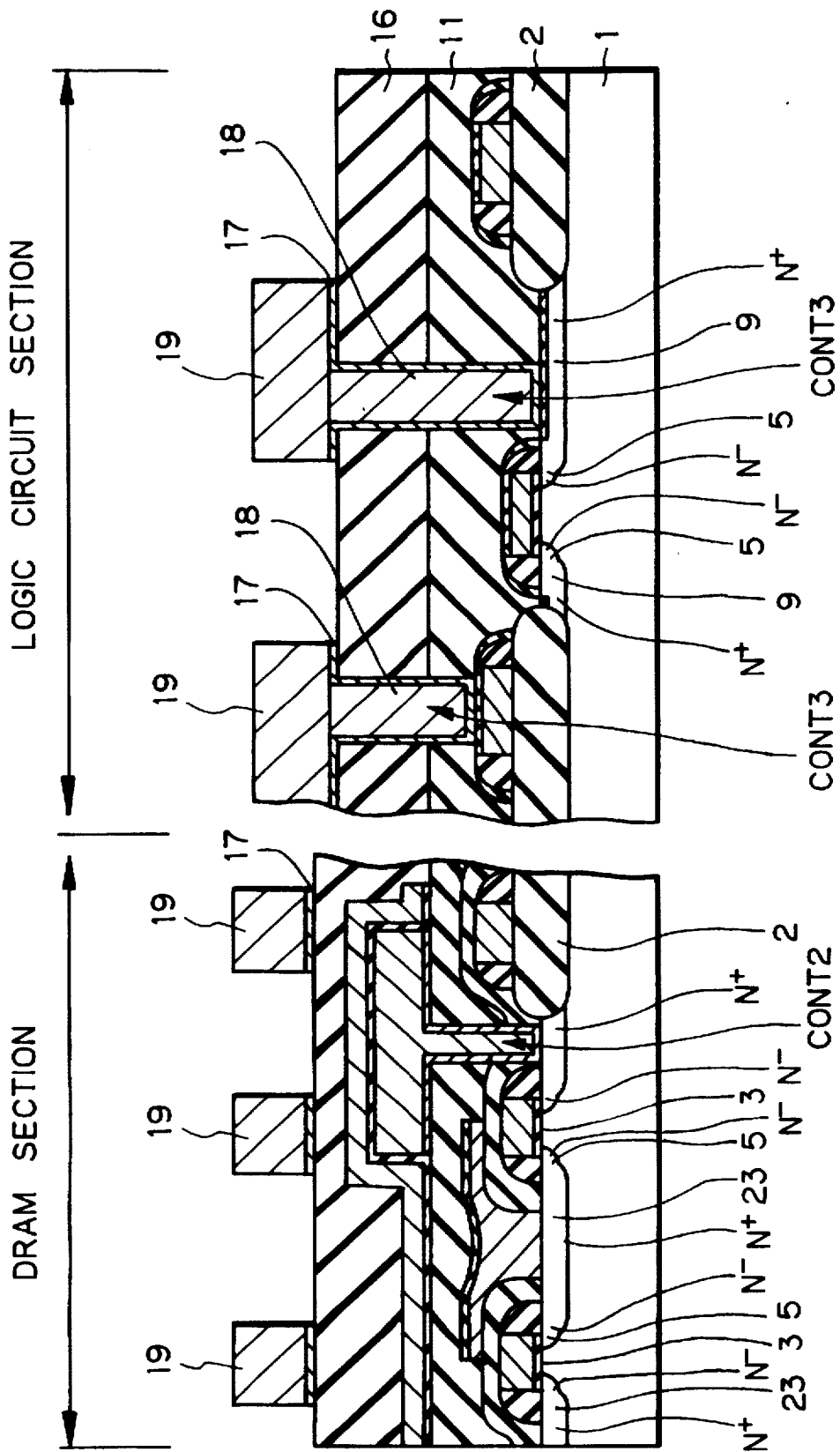

Finally, referring to FIG. 7I, in the same way as in FIG. 5G, an insulating layer 16 made of silicon oxide or the like is formed and is flattened. Then, contact holes CONT3 are perforated in the insulating layers 16 and 11 of the logic circuit section. In this case, contact holes (not shown) are perforated in the insulating layers of peripheral circuit portions of the DRAM section.

Then, a TiN (or Ti) barrier layer 17 is deposited by a sputtering process on the entire surface. In addition, a W layer is formed by a CVD process and is etched back to form contact structures 18 buried in the contact holes CONT3. Also, an aluminum layer 19 is formed, and the aluminum layer 19 as well as the barrier layer 17 is patterned. Subsequently, a plurality of other aluminum layers as illustrated in FIG. 1 are formed to complete the device.

In the third embodiment, the thickness of the sidewall insulating layers in the DRAM section is different from the thickness of the sidewall insulating layers in the logic circuit section, and accordingly, the lightly-doped drain (LDD) configuration in the DRAM section is different from the LDD configuration in the logic circuit section. Therefore, the operation speed of the device can be increased.

As explained hereinabove, according to the present invention, since the agglomeration of salicide is suppressed, the resistance of the salicide cannot be reduced. Also, the manufacturing steps are reduced to decrease the manufacturing cost.

I claim:

1. A method for manufacturing a semiconductor device incorporating a memory section and a circuit section, comprising the steps of:

forming first and second gate electrodes made of a conductive layer on a semiconductor substrate in said memory section and said circuit section, respectively;

introducing first impurities into semiconductor substrate using said first and second gate electrodes as a mask, to form first and second pairs of impurity diffusion regions within said semiconductor substrate in said memory section and said circuit section, respectively;

forming a first insulating layer and perforating a first contact hole in said first insulating layer on one of said first pair of impurity diffusion regions;

forming a polycrystalline silicon layer on said first insulating layer and patterning said polycrystalline silicon layer to form a bit line connected via said first contact hole to said one of said first pair of impurity diffusion regions;

exposing said second gate electrode and said second pair of impurity diffusion regions;

forming a refractory metal layer to cover at least said bit line said second gate electrode and said second pair of impurity diffusion regions;

performing a heating operation upon said refractory metal layer, so that metal silicide layers are formed in said bit line, said second gate electrode and said second pair of impurity diffusion regions; and removing unreacted portions of said refractory metal layer.

2. The method as set forth in claim 1, wherein said conductive layer is made of polycrystalline silicon.

3. The method as set forth in claim 1, wherein said conductivelayer is made of a stacked structure of polycrystalline silicon and metal silicide.

4. The method as set forth in claim 1, further comprising the steps of:

forming a photoresist pattern layer to cover said memory section;

etching back said first insulating layer using said photoresist pattern layer as mask to form a sidewall insulating layer on a sidewall of said second gate electrode; and introducing second impurities into said semiconductor substrate using said photoresist pattern layer, said second gate electrode and said sidewall insulating layer as a mask to form a third pair of impurity diffusion regions in said circuit section.

5. The method as set forth in claim 1, further comprising the steps of:

forming a second insulating layer after removing the unreacted portions of said refractory metal layer;

perforating a second contact hole in said second and first insulating layers on the other of said first pair of impurity diffusion regions;

forming a first metal layer on said second insulating layer and patterning said first metal layer to form a capacitor lower electrode layer connected via said second contacted via said second contact hole to the other of said first of impurity diffusion regions;

forming a $Ta_2O_5$ capacitor dielectric layer on said capacitor lower electrode layer; and forming a second metal layer on said capacitor dielectric layer and patterning said second metal layer to form a capacitor upper electrode layer.

6. The method as set forth in claim 5, further comprising:

forming a third insulating layer after formation of said capacitor upper electrode layer;

perforating a third contact hole in said third and second insulating layers on one of said second impurity diffusion regions; and forming a third metal layer on said third insulating layer and patterning said third metal layer to form a connection layer connected via said third contact hole to said one of said second impurity diffusion regions.

7. A method for manufacturing a semiconductor device incorporating a memory section and a circuit section, comprising the steps of:

forming first and second gate electrodes made of a conductive layer on a semiconductor substrate in said memory section and said circuit section, respectively;

introducing first impurities into semiconductor substrate using said first and second gate electrodes as a mask, to form first and second pairs of impurity diffusion regions within said semiconductor substrate in said memory section and said circuit section, respectively;

forming a first insulating layer on said first and second gate electrodes;

etching pack said first insulating layer to form first sidewall insulating layers on sidewalls of said first and second electrodes;

forming a first photoresist pattern layer to cover said circuit section;

introducing second impurities into said semiconductor substrate using said first photoresist pattern layer, said first gate electrode and said first sidewall insulating layers as a mask, to form a third pair of impurity diffusion regions in said memory section;

forming a second insulating layer and perforating a first contact hole in said second insulating layer on one of said third pair of impurity diffusion regions;

forming a polycrystalline silicon layer on said second insulating layer and patterning said polycrystalline silicon layer to form a bit line connected via said first contact hole to said one of said third pair of impurity diffusion regions;

forming a second photoresist pattern layer to cover said memory section;

etching back said second insulating layer using said second photoresist pattern layer as a mask to form a second sidewall insulating layer on said first sidewall insulating layer of said second gate electrode;

introducing third impurities into said semiconductor substrate using said second photoresist pattern layer, said second gate electrode and said second sidewall insulating layer as a mask, to form a fourth pair of impurity diffusion regions in said circuit section;

exposing said second gate electrode and said fourth pair of impurity diffusion regions;

forming a refractory metal layer to cover at least said bit line said second gate electrode and said fourth pair of impurity diffusion regions;

performing a heating operation upon said refractory metal layer, so that metal silicide layers are formed in said bit line, said second gate electrode and said fourth pair of impurity diffusion regions; and removing unreacted portions of said refractory metal layer.

8. The method as set forth in claim 7, wherein said conductive layer is made of polycrystalline silicon.

9. The method as set forth in claim 7, further comprising the steps of:

forming a third insulating layer after removing the unreacted portions of said refractory metal layer;

perforating a second contact hole in said third and second insulating layers on the other of said third pair of impurity diffusion regions;

forming a first metal layer on said third insulating layer and patterning said first metal layer to form a capacitor lower electrode layer connected via said second contact hole to the other of said third of impurity diffusion regions;

forming a $Ta_2O_5$ capacitor dielectric layer on said capacitor lower electrode layer; and forming a second metal layer on said capacitor dielectric layer and patterning said second metal layer to form a capacitor upper electrode layer.

10. The method as set forth in claim 9, further comprising:

forming a fourth insulating layer after formation of said capacitor upper electrode layer;

perforating a third contact hole in said fourth and third insulating layers on one of said fourth impurity diffusion regions; and forming a third metal layer on said fourth insulating layer and patterning said third metal layer to form a connection layer connected via said third contact hole to said one of said fourth impurity diffusion regions.

* * * * *

UNITED STATES PATENT AND TRADEMARK OFFICE
CERTIFICATE OF CORRECTION

PATENT NO.  :  5,759,889
DATED       :  June 2, 1998
INVENTOR(S) :  Masato Sakao It is certified that error appears in the above-identified patent and that said Letters Patent is hereby corrected as shown below:

Claim 7, Col. 11, line 16, "pack" should be --back--

Signed and Sealed this

Twenty-sixth Day of October, 1999

Attest:

Q. TODD DICKINSON

*Attesting Officer*          *Acting Commissioner of Patents and Trademarks*